(12) United States Patent
Joo et al.

(10) Patent No.: US 7,348,616 B2
(45) Date of Patent: Mar. 25, 2008

(54) FERROELECTRIC INTEGRATED CIRCUIT DEVICES HAVING AN OXYGEN PENETRATION PATH

(75) Inventors: Heung-jin Joo, Kyungki-do (KR);
Ki-nam Kim, Kyungki-do (KR);
Yoon-jong Song, Seoul (KR)

(73) Assignee: Samsung Electronics Co., Ltd. (KR)

( * ) Notice: Subject to any disclaimer, the term of this patent is extended or adjusted under 35 U.S.C. 154(b) by 23 days.

(21) Appl. No.: 11/248,629

(22) Filed: Oct. 12, 2005

(65) Prior Publication Data

US 2006/0108622 A1    May 25, 2006

Related U.S. Application Data

(62) Division of application No. 10/308,843, filed on Dec. 3, 2002, now Pat. No. 6,979,881.

(30) Foreign Application Priority Data

Jan. 30, 2002    (KR) ................................. 2002-5421

(51) Int. Cl.
*H01L 29/76*  (2006.01)
(52) U.S. Cl. .................. 257/295; 257/296; 257/303; 257/306; 257/310; 257/E27.104
(58) Field of Classification Search ............ 257/295, 257/296, 298, 303, 306, 310, E27.104, E21.664
See application file for complete search history.

(56) References Cited

U.S. PATENT DOCUMENTS

| | | | |
|---|---|---|---|
| 5,198,994 A | 3/1993 | Natori | 365/145 |
| 5,523,964 A | 6/1996 | McMillan et al. | 365/145 |
| 6,441,420 B1* | 8/2002 | Nagano et al. | 257/296 |
| 6,521,927 B2 | 2/2003 | Hidaka et al. | 257/295 |
| 6,623,986 B2 | 9/2003 | Ogata et al. | 483/3 |
| 6,844,581 B2 | 1/2005 | Sitaram et al. | 257/295 |
| 2002/0028539 A1* | 3/2002 | Ema | 438/132 |
| 2002/0036307 A1 | 3/2002 | Song | 257/296 |
| 2002/0038402 A1* | 3/2002 | Kanaya | 711/1 |
| 2002/0040988 A1 | 4/2002 | Hidaka et al. | 257/296 |
| 2002/0047146 A1 | 4/2002 | Ogata et al. | 257/295 |
| 2002/0061604 A1 | 5/2002 | Sitaram et al. | 438/3 |
| 2002/0066921 A1 | 6/2002 | Sitaram et al. | 257/310 |
| 2002/0115227 A1 | 8/2002 | Sitaram et al. | 438/3 |

* cited by examiner

*Primary Examiner*—Evan Pert
*Assistant Examiner*—Tan Tran
(74) *Attorney, Agent, or Firm*—Myers Bigel Sibley & Sajovec

(57) ABSTRACT

Ferroelectric integrated circuit devices, such as memory devices, are formed on an integrated circuit substrate. Ferroelectric capacitor(s) are on the integrated circuit substrate and a further structure on the integrated circuit substrate overlies at least a part of the ferroelectric capacitor(s). The further structure includes at least one layer providing a barrier to oxygen flow to the ferroelectric capacitor(s). An oxygen penetration path contacting the ferroelectric capacitor(s) is interposed between the ferroelectric capacitor(s) and the further structure. The layer providing a barrier to oxygen flow may be an encapsulated barrier layer. Methods for forming ferroelectric integrated circuit devices, such as memory devices, are also provided.

16 Claims, 35 Drawing Sheets

FERROELECTRIC INTEGRATED CIRCUIT DEVICES HAVING AN OXYGEN PENETRATION PATH

RELATED APPLICATIONS

This application claims priority to and is a divisional of parent application Ser. No. 10/308,843, filed Dec. 3, 2002, now issued U.S. Pat. No. 6,979,881, which claims the benefit of Korean Patent Application No. 2002-5421, filed Jan. 30, 2002, the disclosures of which are hereby incorporated herein by reference.

BACKGROUND OF THE INVENTION

The present invention relates to integrated circuit devices and, more particularly, to ferroelectric integrated circuit devices, such as memory devices, including a ferroelectric capacitor and methods for manufacturing the same.

Recently, ferroelectric memory devices using ferroelectric layers have been considered as an alternative approach for certain memory applications. Ferroelectric memory devices are generally divided into two categories. The first category includes devices using a ferroelectric capacitor as described, for example, in U.S. Pat. No. 5,523,964. The second category includes devices having a ferroelectric field emission transistor (FET) as described, for example, in U.S. Pat. No. 5,198,994. Ferroelectric memory devices generally use polarization inversion and remnant polarization characteristics of an included ferroelectric layer to provide desired properties to the memory devices. These devices may provide higher-speed read and write operations and/or lower power consumption than other types of memory devices.

Because polarization inversion of a ferroelectric layer results from rotation of a dipole, ferroelectric memory devices may have an operation speed over 100 times faster than other nonvolatile memory devices, such as Electrical Erasable Programmable Read Only Memory (EEPROM) devices or flash memory devices. In addition, with optimized designs, ferroelectric memory devices may result in write operation speeds ranging from several hundreds of nanoseconds to several tens of nanoseconds. Such high speed operations may even be comparable to the operating speed of Dynamic Random Access Memory (DRAM) devices. With respect to possible power savings, EEPROM or flash memory devices typically require use of a high voltage of about 18 volts (V) through about 22 V for a write operation. Ferroelectric memory devices generally only need about 2 V through about 5 V for polarization inversion. Accordingly, they may be designed to operate with a single low-voltage power supply.

Performance of ferroelectric memory devices in the first category including a ferroelectric capacitor may be influenced by the characteristics of the ferroelectric capacitor. The characteristics of the ferroelectric capacitors may be significantly degraded, for example, during backend integration processes that are typically performed after the ferroelectric capacitor is formed. Examples of such backend integration processes include an InterLayer Dielectric (ILD) process, an InterMetal Dielectric (IVD) process, and a passivation process. These processes are generally performed by a chemical vapor deposition (CVD) method or a plasma enhanced CVD method. Such methods generally use hydrogen gas or silane (SiH4) gas containing hydrogen as a carrier gas. The carrier gas may act as a reducing gas, resulting in nonuniform charge distribution in the ferroelectric material of the capacitor. If the carrier gas is captured by the interface between top and bottom electrodes of the capacitor, the energy barrier between them may be lowered and the leakage current characteristic of the ferroelectric capacitor may be degraded. Furthermore, the carrier gas may react with oxygen within the ferroelectric material and oxygen vacancies may be induced within the ferroelectric layer. As a result, device performance after the backend integration process may be degraded.

SUMMARY OF THE INVENTION

Embodiments of the present invention include ferroelectric integrated circuit devices formed on an integrated circuit substrate. A ferroelectric capacitor is on the integrated circuit substrate and a further structure on the integrated circuit substrate overlies at least a part of the ferroelectric capacitor. The further structure includes at least one layer providing a barrier to oxygen flow to the ferroelectric capacitor. An oxygen penetration path contacting the ferroelectric capacitor is interposed between the ferroelectric capacitor and the further structure. The layer providing a barrier to oxygen flow may be an encapsulated barrier layer.

A plurality of ferroelectric capacitors may be arranged on the integrated circuit substrate in row and column directions to define a plurality of rows of ferroelectric capacitors. At least one plate line may be provide that is connected to at least two adjacent ferroelectric capacitors in different rows. The encapsulated barrier layer may be configured to limit penetration of a carrier gas to the ferroelectric capacitor during a backend process after the ferroelectric capacitor is formed. The oxygen penetration path may be configured to provide a flow of oxygen to a ferroelectric layer of the ferroelectric capacitor during a recovery annealing process after the ferroelectric capacitor is formed.

In other embodiments of the present invention, the ferroelectric capacitor includes a stacked bottom electrode, the ferroelectric layer and a top electrode. The bottom electrode may include a metal oxide layer underlying the ferroelectric layer that compensates for oxygen vacancies in an interface between the bottom electrode and the ferroelectric layer. The bottom electrode may further include a metal layer between the metal oxide layer and the ferroelectric layer that induces interface lattice matching to the ferroelectric layer. The metal oxide layer may be a noble metal oxide, the ferroelectric layer may be $Pb(Zr,Ti)O_3$ (PZT) and the metal layer may be platinum. In particular embodiments, the top electrode includes a metal oxide layer overlying the ferroelectric layer that compensates for oxygen vacancies in an interface between the top electrode and the ferroelectric layer.

In further embodiments of the present invention, the oxygen penetration path is an oxygen penetration path layer that wraps the ferroelectric capacitors and is made of titanium oxide and/or silicon oxide. The encapsulated barrier layer may be a metal oxide layer selected from the group consisting of an aluminum oxide layer, a titanium oxide layer, a zirconium oxide layer, a tantalum oxide layer, and a cesium oxide layer. In particular embodiments, the encapsulated barrier layer is a double layer including a metal oxide layer that is heat-treated and a metal oxide layer that is formed on the heat-treated metal oxide layer without being heat-treated.

In other embodiments of the present invention, the ferroelectric capacitors include a bottom electrode, a ferroelectric layer pattern, and a top electrode, all of which are stacked sequentially. At least one plate line directly contacts at least two adjacent rows of top electrodes. The oxygen penetration path may be an oxygen penetration path layer that wraps the ferroelectric capacitors and the at least one plate line may be at least one common plate line that conductively contacts at least two adjacent rows of the ferroelectric capacitors through a slit-type common via-hole that extends through the further structure, the encapsulated barrier layer, and the oxygen penetration path layer.

In further embodiments of the present invention, the device is a memory device and further includes an underlying interlayer insulation layer between the ferroelectric capacitors and the integrated circuit substrate. A plurality of cell transistors arranged on the integrated circuit substrate in the row and column directions may be included within the underlying interlayer insulation layer. A plurality of bit lines are electrically connected to drain regions of the cell transistors and a plurality of contact plugs are electrically connected to source regions of the cell transistors. The ferroelectric capacitors are electrically connected to the source regions through the contact plugs. The further structure may include a stacked first top interlayer insulation layer and second top interlayer insulation layer and the ferroelectric integrated circuit device may further include main word lines formed between the first and second top interlayer insulation layers parallel to the row direction.

In other embodiments of the present invention, methods are provided of fabricating a ferroelectric integrated.circuit device. At least one ferroelectric capacitor is formed on an integrated circuit substrate. An oxygen penetration path layer is formed on the at least ferroelectric capacitor. An encapsulated barrier layer is formed on the oxygen penetration path layer. An interlayer insulation layer is formed on the encapsulated barrier layer. A common via hole is formed through the interlayer insulation layer, the encapsulated barrier layer and at least part of the oxygen penetration path layer to define an oxygen penetration path to a ferroelectric layer of the at least one ferroelectric capacitor through the oxygen penetration path layer.

In further embodiments of the present invention, forming a common via hole is followed by recovery annealing the integrated circuit device to reduce oxygen vacancies in the ferroelectric layer by providing oxygen to the ferroelectric layer through the oxygen penetration path. Following forming of the encapsulated barrier layer and before forming of the common via hole, the the integrated circuit device may be exposed to hydrogen gas during a backend process. Forming the common via hole may include forming a slit-type common via hole exposing at least part of the at least one plate line and recovery annealing may be followed by forming a common plate line in the common via hole that electrically contacts the at least one plate line.

In further embodiments of the present invention, ferroelectric memory devices include ferroelectric capacitors that are indirectly wrapped by an encapsulated barrier layer with an oxygen penetration path interposed therebetween. The ferroelectric capacitors are two-dimensionally arranged on an underlying interlayer insulation layer formed on a semiconductor substrate in the row and column directions of the semiconductor substrate. A plurality of plate lines are disposed to be parallel to the row direction, and each of the plate lines is electrically connected to at least two adjacent rows of ferroelectric capacitors.

The plate lines may include local plate lines, which are covered with the oxygen penetration path layer included in the oxygen penetration path, or may be common plate lines, which are electrically connected to ferroelectric capacitors through slit-type common via-holes piercing through the oxygen penetration path layer, the encapsulated barrier layer, and a top interlayer insulation layer formed overlying the ferroelectric capacitors. Alternatively, the plate line may include both the local plate lines and the common plate lines.

Each of the ferroelectric capacitors may be composed of a bottom electrode, a ferroelectric layer pattern, and a top electrode, all of which are stacked sequentially. When the ferroelectric memory device includes a local plate line that directly contacts the top electrodes of at least two adjacent rows of ferroelectric capacitors, a gap between the ferroelectric capacitors is filled with an oxygen penetration path layer pattern or a stack structure composed of the oxygen penetration path layer pattern, an encapsulated barrier layer pattern, and an insulation layer pattern, and the oxygen penetration path layer covering the local plate lines is connected to the oxygen penetration path layer pattern. When the ferroelectric memory device includes a common plate line without the local plate lines, the surface throughout the ferroelectric capacitors may be covered with only the oxygen penetration path layer.

Alternatively, a common top electrode may be used that covers at least two adjacent rows of ferroelectric layer patterns. The oxygen penetration path layer may include a second oxygen penetration path layer pattern exposing the common top electrodes. When the ferroelectric memory device includes a common plate line without using local plate lines, the surface throughout the common top electrodes may be covered with the oxygen penetration path layer, and the oxygen penetration path layer may be connected to the first oxygen penetration path layer pattern. The common ferroelectric layer pattern may cover at least two adjacent rows of bottom electrodes.

In other embodiments of the present invention, methods are provided of fabricating a ferroelectric memory device. An underlying interlayer insulation layer is formed on a semiconductor substrate. A plurality of ferroelectric capacitors are formed on the underlying interlayer insulation layer to be two-dimensionally arranged in the row and column directions of the semiconductor substrate. An encapsulated barrier layer indirectly wrapping the ferroelectric capacitors with an oxygen penetration path interposed therebetween is formed. A plurality of plate lines are formed, each of which is parallel to the row direction and is electrically connected to at least two adjacent rows of ferroelectric capacitors.

BRIEF DESCRIPTION OF THE DRAWINGS

Other features of the present invention will be more readily understood from the following detailed description of the invention when read in conjunction with the accompanying drawings, in which.

DETAILED DESCRIPTION OF THE INVENTION

Figure 1:
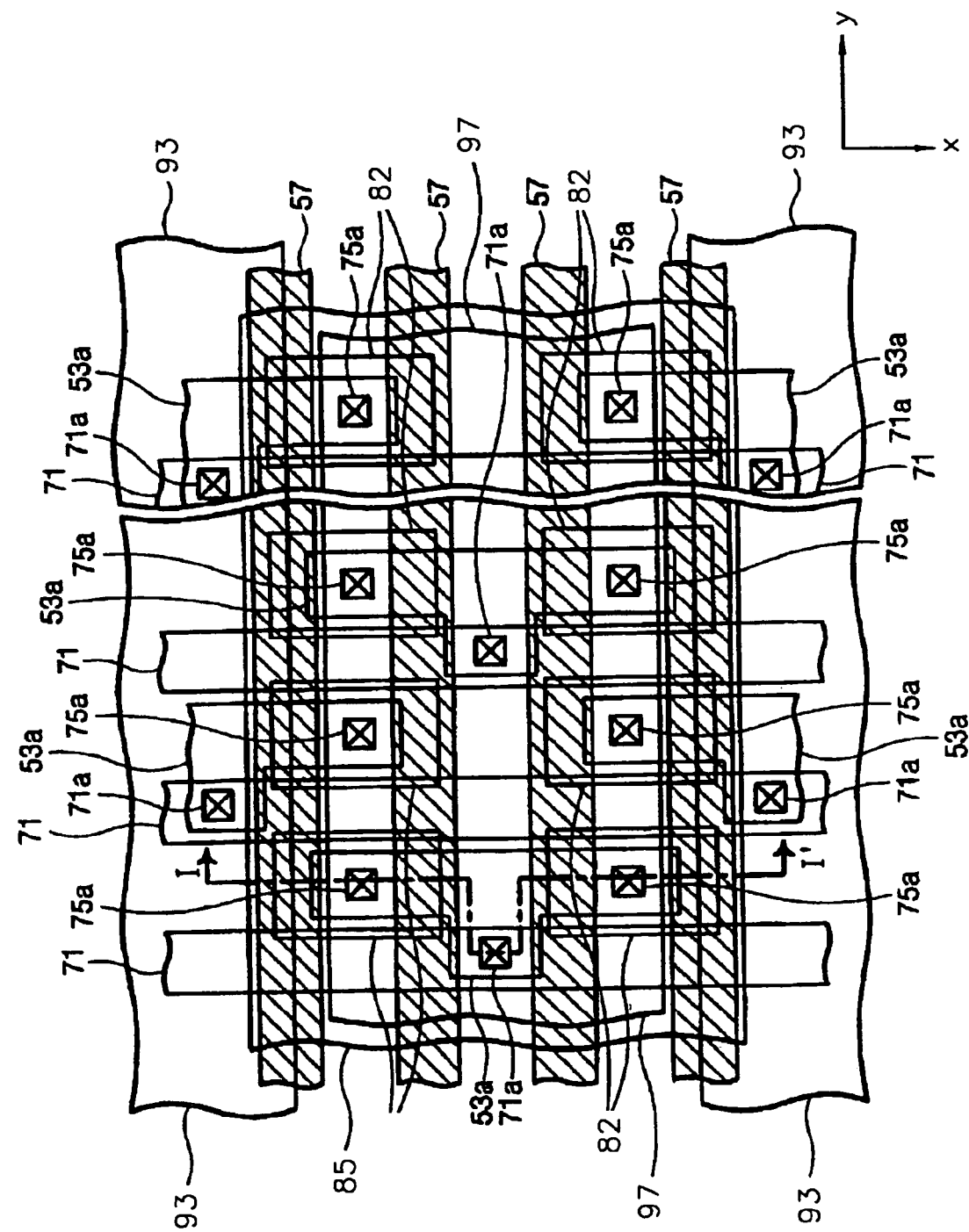
FIG. 1 is a plane view diagram illustrating a cell array area of a ferroelectric memory device according to embodiments of the present invention.

The present invention now will be described more fully hereinafter with reference to the accompanying drawings, in which typical embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of regions may be exaggerated for clarity. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Integrated circuit devices and methods for forming such devices in accordance with embodiments of the present invention will now be described with reference to the Figures. FIG. 1 is a plane view illustrating a cell array area of a ferroelectric integrated circuit device, in particular, a memory device, according to some embodiments of the present invention. Various embodiments of the present invention will now be described with reference to the plane view of FIG. 1 and respective cross-section perspective views of various embodiments illustrated in FIGS. 2-10. To simplify understanding of the present disclosure, the various embodiments of the present invention described herein will be described with reference to a memory device, but the present invention can be applied to devices other than memory devices.

Figure 2:
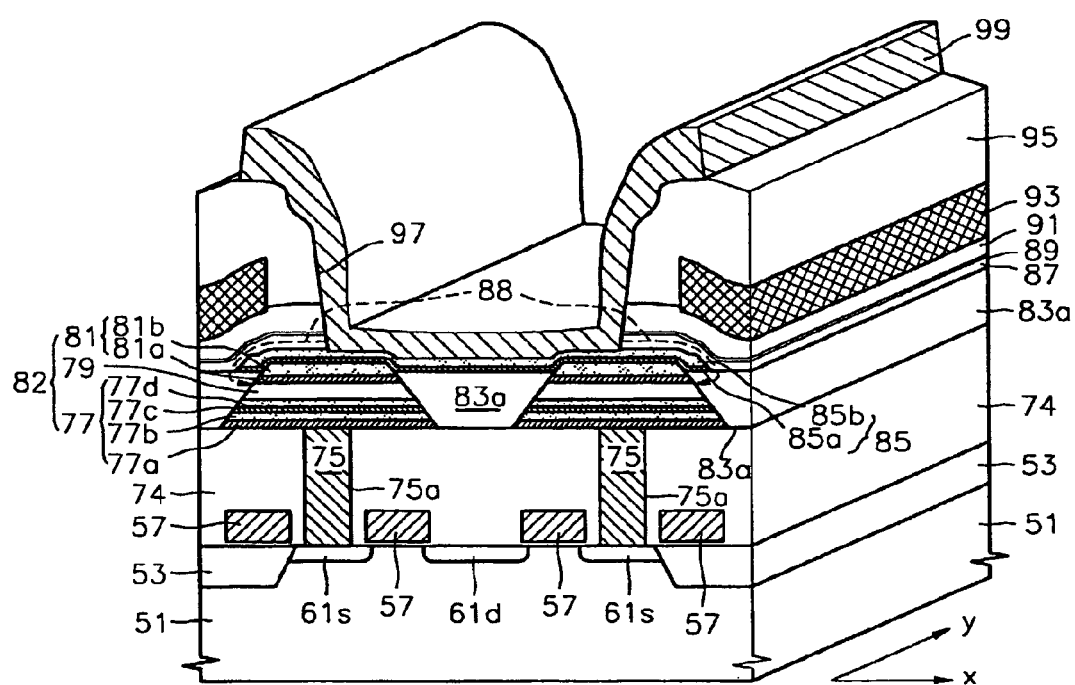
FIGS. 2-10 are perspective cross-sectional diagrams illustrating a ferroelectric integrated circuit device according to further embodiments of the present invention.

FIG. 2 is a cross-sectional perspective view of a ferroelectric memory device according to first embodiments of the present invention. Referring to FIGS. 1 and 2, a plurality of active regions 53a are two-dimensionally defined by a device isolation layer 53 formed in a predetermined region of an integrated circuit (semiconductor) substrate 51. A plurality of insulated gate electrodes, shown as word lines 57, are disposed to cross the active regions 53a and the device isolation layer 53. As shown in FIG. 1, the word lines 57 are parallel to a row (y-axis) direction of the cell array. Each of the active regions 53a intersects a pair of word lines 57. A common drain region 61d is formed in the active region 53a between a pair of the word lines 57. Source regions 61s are formed in the active regions 53a at both sides of the common drain region 61d. Cell transistors are formed where the word lines 57 intersect the active regions 53a. As shown in FIG. 1, the cell transistors are two-dimensionally arranged in column (x-axis) and row (y-axis) directions.

The entire surface of the semiconductor substrate 51 in the region of the cell transistors is covered with an underlying interlayer insulation layer 74 as shown in FIG. 2. A plurality of bit lines 71 passing over the word lines 57 are disposed within the underlying interlayer insulation layer 74 and pass over the word lines 57 in the column direction as shown in FIG. 1. Each of the bit lines 71 may be electrically connected to the common drain region 61d through a bit line contact hole 71a. As shown in FIG. 2, the source regions 61s are exposed through storage node contact holes 75a piercing through the underlying interlayer insulation layer 74. Each of the storage node contact holes 75a may then be filled with a contact plug 75.

As with the cell transistors, a plurality of ferroelectric capacitors 82 are two-dimensionally arranged in the column and row directions over a region of the semiconductor substrate 51 including the contact plugs 75. For the embodiments illustrated in FIGS. 2-10, a ferroelectric capacitor 82 includes a bottom electrode 77, a ferroelectric layer pattern 79, and a top electrode 81. These layers may be sequentially stacked. The bottom electrode 77 of respective ones of the ferroelectric capacitors 82 are disposed on corresponding contact plugs 75 to electrically connect a ferroelectric capacitor 82 to each of the cell transistors. More particularly, the bottom electrodes 77 are electrically connected to the source regions 61s through the contact plugs 75.

The bottom electrodes 77 may be a multi-layer structure including an adhesive layer 77a, a bottom diffusion preventing layer 77b, a bottom metal oxide layer 77c, and a bottom metal layer 77d. The ferroelectric layer pattern 79 may be formed of a ferroelectric material, for example, $SrTiO_3$, $BaTiO_3$, (Ba, Sr) $TiO_3$, Pb(Zr, Ti)$O_3$, $SrBi2Ta2O_9$, (Pb, La)(Zr, Ti)$O_3$, $Bi4Ti3O_{12}$, or a compound of ones of these material from the SBT or PZT family.

In particular embodiments of the present invention, the top electrode 81 is a double layer structure including a top metal oxide layer 81a and a top diffusion preventing layer 81b. A gap between adjacent ferroelectric capacitors 82 may be filled with an oxygen penetration path layer pattern 83a. The oxygen penetration path layer pattern 83a may be provided so as to surround the sidewall of the bottom electrode 77 and the sidewall of the ferroelectric layer pattern 79 and, in some embodiments to at least partially surround the sidewall of the top electrode 81. The oxygen penetration path layer pattern 83a may be formed from a layer of a material that can be penetrated by oxygen. For example, a silicon oxide (SiO2) layer or a titanium oxide (TiO2) layer can be used for the oxygen penetration path layer pattern 83a.

For the embodiments illustrated in FIG. 2, local plate lines 85 are disposed on the ferroelectric capacitors 82 and the oxygen penetration path layer pattern 83a. The local plate lines 85 are parallel to the row (y-axis) direction. Each of the local plate lines 85 covers at least two adjacent rows of ferroelectric capacitors 82. More particularly, as shown in FIG. 2, each of the local plate lines 85 may directly contact at least two adjacent rows of the top electrodes 81 of the ferroelectric capacitors 82. In addition, the local plate lines 85 may act as etch stop layers during a later etching process for forming a slit-type common via-hole 97. Like the top electrode 81, each of the local plate lines 85 may be a double layer structure including a metal oxide layer 85a and a diffusion preventing layer 85b.

The entire surface of the semiconductor substrate 51 in the region of the local plate lines 85 may be covered with an oxygen penetration path layer 87, thereby completing an oxygen penetration path 88 through the oxygen penetration path layer 87 and the underlying oxygen penetration path layer pattern 83a to the ferroelectric layer pattern 79. The oxygen penetration path 88 may allow oxygen to be effectively supplied to the ferroelectric layer pattern 79 during a recovery annealing process performed after formation of the slit-type common via-hole 97 to reduce the potential for/ number of oxygen vacancies in the the ferroelectric layer pattern 79 of the resulting capacitors. In other words, the oxygen penetration path 88 may subsequently be used to repair the ferroelectric layer pattern 79 after oxygen vacancies have been introduced to the ferroelectric layer pattern 79.

For the embodiments illustrated in FIGS. 2-10, an encapsulated barrier layer 89 is formed on the oxygen penetration path layer 87. The encapsulated barrier layer 89 may be a single layer of a metal oxide, such as an aluminum oxide layer, a titanium oxide layer, a zirconium oxide layer, a tantalum oxide layer, or a cesium oxide layer. Alternatively, the encapsulated barrier layer 89 may be a double layer structure formed by heat-treating a metal oxide layer and depositing another metal oxide layer on the heat-treated metal oxide layer, which may enhance the effectiveness of the barrier layer 89. The encapsulated barrier layer 89 can prevent or limit the ability of a carrier gas, such as hydrogen, to penetrate to the ferroelectric layer pattern 79. If the ferroelectric layer pattern 79 is penetrated by hydrogen atoms, the reliability of the ferroelectric layer pattern 79 may be decreased. More particularly, oxygen atoms within the ferroelectric layer pattern 79 may react with the hydrogen atoms to produce oxygen vacancies. Such oxygen vacancies may degrade the polarization characteristic of the ferroelectric material, which may cause the resulting ferroelectric memory device to malfunction or have reduced performance characteristics.

In addition, if hydrogen atoms are captured by the interfaces between the ferroelectric layer pattern 79 and the top electrode 81 and the bottom electrode 77, energy barriers among the layers may be lowered. Therefore, the encapsulated barrier layer 89 may improve the characteristics and reliability of the resulting ferroelectric capacitors 82.

The entire surface of the semiconductor substrate 51 in the region of the encapsulated barrier layer 89 may be covered with a top interlayer insulation layer. The top interlayer insulation layer may include first and second top interlayer insulation layers 91 and 95, which may be formed sequentially. For a memory device, a plurality of main word lines 93 may be interposed between the first and second top interlayer insulation layers 91 and 95. Each of the main word lines 93 typcially controls four of the word lines 57 through a decoder. A common plate line 99 may also be electrically connected to the local plate line 85 through the slit-type common via-hole 97 through the second and first top interlayer insulation layers 95 and 91, the encapsulated barrier layer 89, and the oxygen penetration path layer 87. The slit-type common via-hole 97 may extend parallel to the row (y-axis) direction.

As shown in FIG. 1, the width of the slit-type common via-hole in some embodiments of the present invention is large enough to simultaneously expose the top electrodes of capacitors disposed in two adjacent rows. Accordingly, the width of the slit-type common via-hole 97 may be larger than that of a conventional via-hole, where the via-hole is formed to expose the top electrodes of capacitors disposed in only one row. As a result, the process margin during a photolithographic process may be increased for such embodiments of the present invention.

Figure 3:
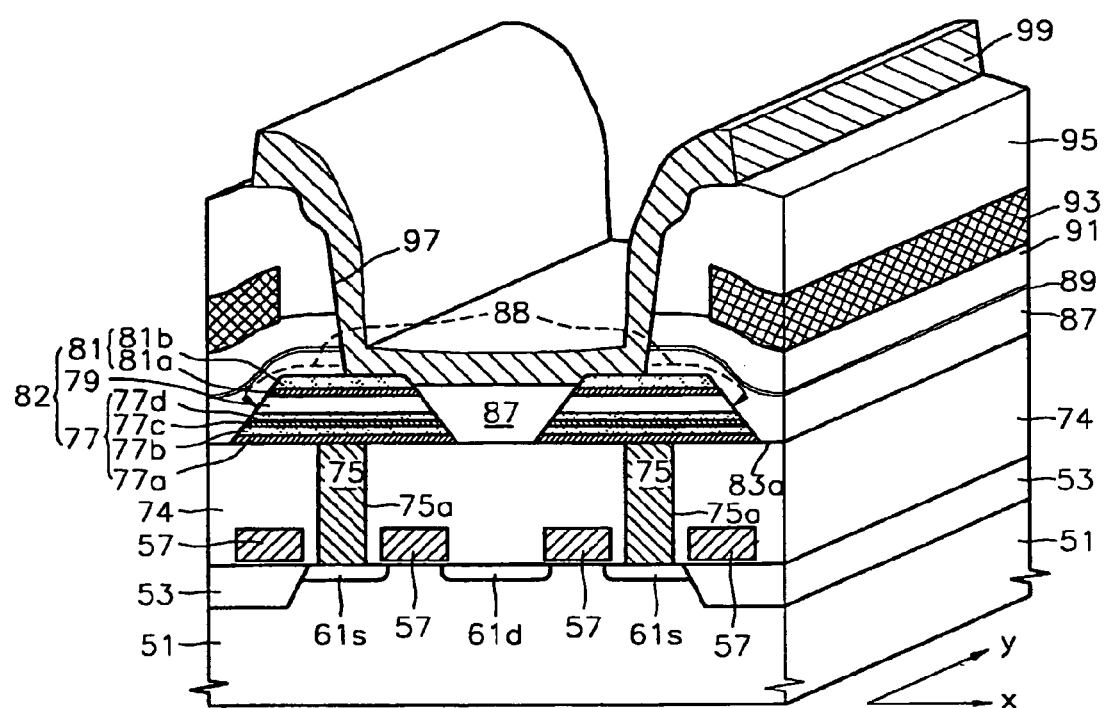

Further embodiments of the present invention will now be described with reference to FIG. 3. FIG. 3 differs from the embodiments described with reference to FIG. 2 in that the local plate lines are not included and only a common plate line 99 is provided. Cell transistors, underlying interlayer insulation layers, contact plugs, and capacitors are substantially the same as described with reference to the like numbered items in FIG. 2 and will not be further described herein.

As shown in FIG. 1 and FIG. 3, for the embodiments illustrated in FIG. 3, the entire surfaces of a plurality of ferroelectric capacitors 82 may be two-dimensionally arranged in the row (y-axis) and column (x-axis) directions and may be covered with a stack layer including an oxygen penetration path layer 87 and an encapsulated barrier layer 89. An oxygen penetration path 88, indicated by an arrow-headed dotted line along the oxygen penetration path layer 87, is provided so that oxygen may be effectively supplied to a ferroelectric layer pattern 79 during a recovery annealing process, which may be performed after the slit-type common via-hole 97 (or other type via-hole exposing the oxygen penetration path through the encapsulated barrier layer) is formed. In addition, the common plate line 99 shown in FIG. 3 electrically contacts at least two adjacent row of the top electrodes 81 of the ferroelectric capacitors 82 through the slit-type common via-hole 97, which extends through the top interlayer insulation layers 95 and 91, the encapsulated barrier layer 89, and the oxygen penetration path layer 87.

Figure 4:
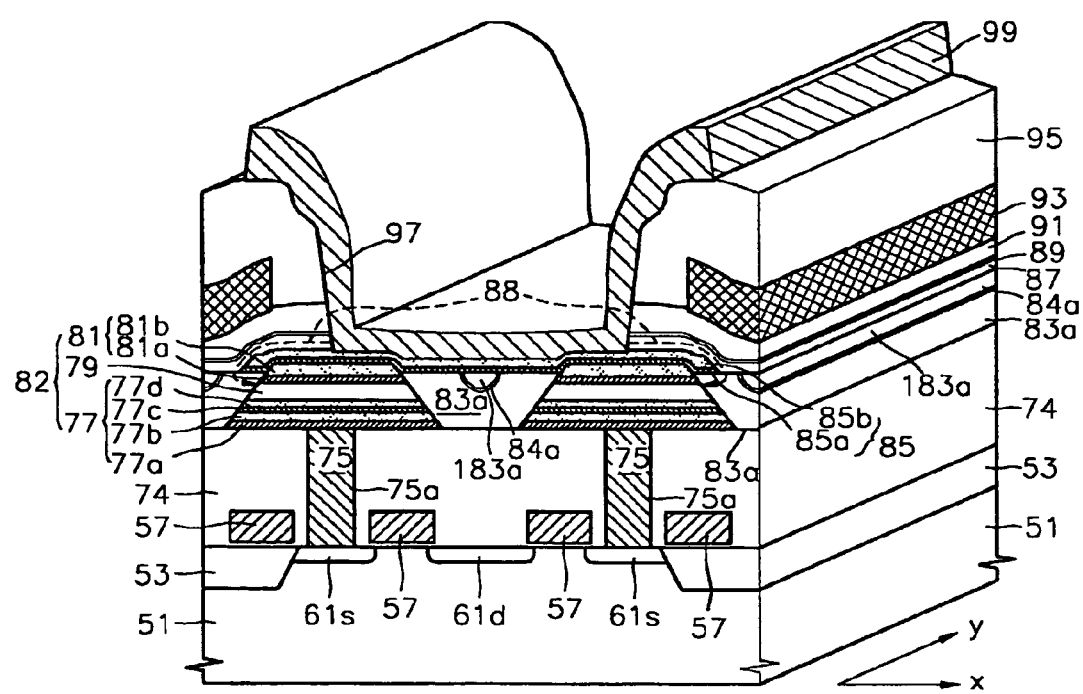

Further embodiments of the present invention will now be described with reference to FIG. 4. FIG. 4 differs from the embodiments described with reference to FIG. 2 in that the embodiments of FIG. 4 further include an encapsulated barrier layer pattern 84a. Cell transistors, underlying interlayer insulation layers, contact plugs, and capacitors are substantially the same as described for the like numbered items in FIG. 2 and such aspects will not be further described with reference to FIG. 4.

As shown in FIG. 1 and FIG. 4, for the embodiments illustrated in FIG. 4, the plurality of ferroelectric capacitors 82 may be two-dimensionally arranged in the row (y-axis) and column (x-axis) directions and a gap between the ferroelectric capacitors 82 may be filled with an oxygen penetration path layer pattern 83a, the encapsulated barrier layer pattern 84a, and an insulation layer pattern 183a. The encapsulated barrier layer pattern 84a may be formed on the oxygen penetration path layer pattern 83a to provide an oxygen penetration path 88, as indicated by an arrow-headed dotted line in FIG. 4, through the oxygen penetration path layer 87 covering the local plate lines 85 to the oxygen penetration path layer pattern 83*a*. The insulation layer pattern 183*a* may be formed of the same material as the oxygen penetration path layer pattern 83*a*. The local plate lines 85, the oxygen penetration path layer 87, an encapsulated barrier layer 89, the first and second top interlayer insulation layers 91 and 95, the main word lines 93, and the common plate lines 99 may then have the same structure as described for like numbered items with reference to FIG. 2.

Further embodiments of the present invention will now be described with reference to FIG. 5. The embodiments of FIG. 5 differ from the embodiments described with reference to FIG. 2 in that the embodiments of FIG. 5 include a common top electrode 81' for individual capacitors 82 instead of having individual top electrodes for the individual capacitors 82 as illustrated in FIG. 2. Cell transistors, underlying interlayer insulation layers and contact plugs are substantially the same as described for the like numbered items in FIG. 2 and such aspects will not be further described with reference to FIG. 5.

Figure 5:
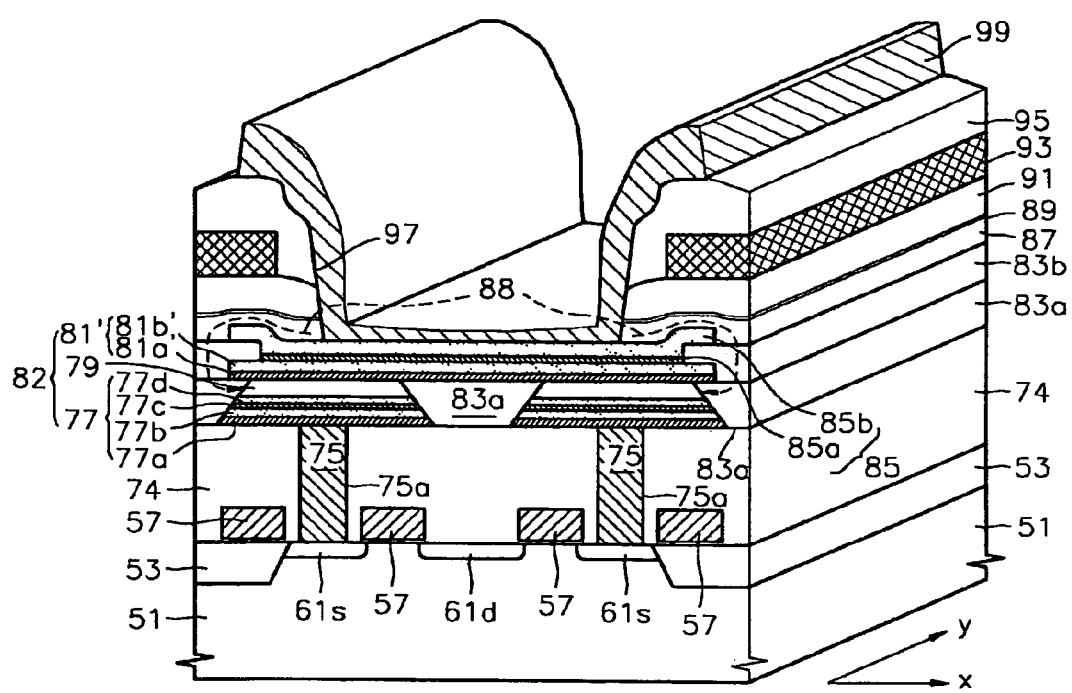

As shown in FIG. 1 and FIG. 5, for the embodiments illustrated in FIG. 5, the plurality of ferroelectric capacitors 82 may be two-dimensionally arranged in the row (y-axis) and column (x-axis) directions covering the contact plugs 75. Each of the ferroelectric capacitors 82 may include a bottom electrode 77, a ferroelectric layer pattern 79, and the common top electrode 81', which may be sequentially formed. The common top electrode 81' extends to cover at least two adjacent rows of ferroelectric layer patterns 79. Thus, like the local plate line 85 shown in FIG. 1, the common top electrode 81' may be parallel to the row (y-axis) direction. A gap between the ferroelectric layer patterns 79 and a gap between the bottom electrodes 77 may be filled with a first oxygen penetration path layer pattern 83*a*.

The entire surface of a semiconductor substrate 51 region including the common top electrode 81' may be covered with a second oxygen penetration path layer pattern 83*b* that has a slit contact hole therein to expose the common top electrode 81'. The slit contact hole is parallel to the row (y-axis) direction and is filled with a local plate line 85 for the embodiments of FIG. 5. As a result, the local plate line 85 may directly contact the common top electrode 81' through the slit contact hole. The entire surface of the semiconductor substrate 51 region including the local plate line 85 may be covered with a stack layer, which, as illustrated in FIG. 5, includes an oxygen penetration path layer 87 and an encapsulated barrier layer 89. An oxygen penetration path 88 is thereby provided through the oxygen penetration path layer 87 and the second and first oxygen penetration path layer patterns 83*b* and 83*a* to the ferroelectric layer patterns 79. The first and second top interlayer insulation layers 91 and 95, the main word lines 93, and the common plate line 99 may then have the same structure as described for like numbered items with reference to FIG. 2.

Further embodiments of the present invention will now be described with reference to FIG. 6. The embodiments of FIG. 6 differ from the embodiments described with reference to FIG. 5 in that no local plate line is provided and so the only plate line is the common plate line 99. Descriptions of like numbered items corresponding to the descriptions provided for FIGS. 2 and 5 above not pertinent to understanding the embodiments of FIG. 6 will not be further described with reference to FIG. 6.

Figure 6:
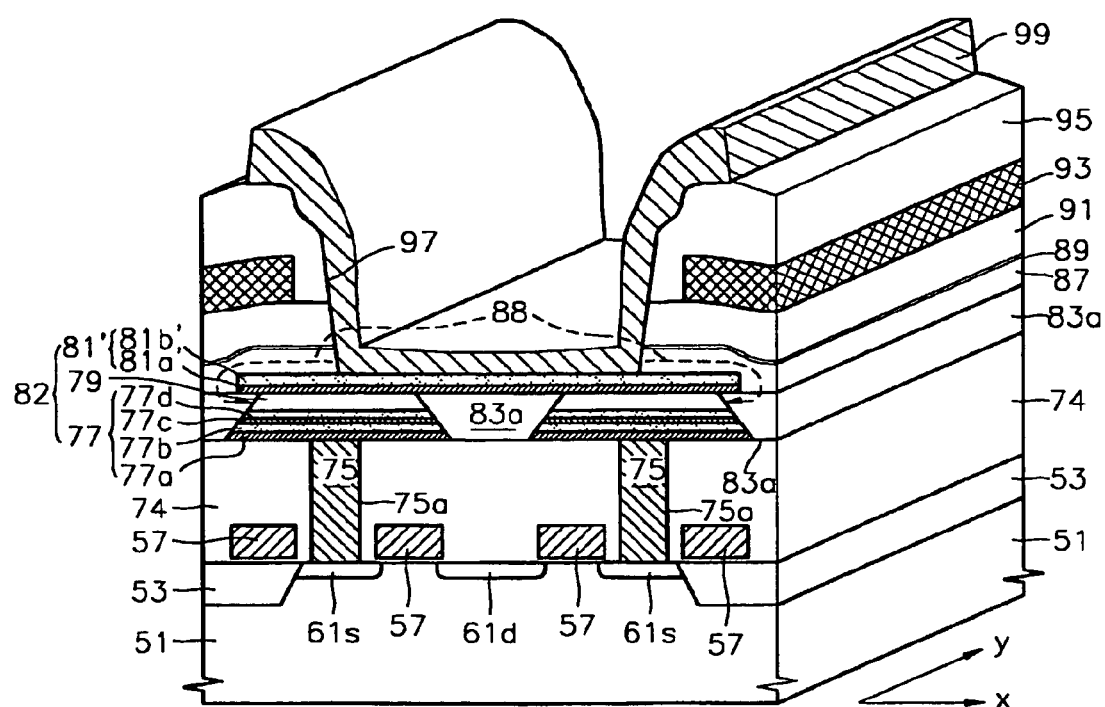

As shown in FIG. 1 and FIG. 6, for the embodiments illustrated in FIG. 6, the plurality of ferroelectric capacitors 82 may be two-dimensionally arranged in the row (y-axis) and column (x-axis) directions. The ferroelectric capacitors 82 include a bottom electrode 77, a ferroelectric layer pattern 79, and the common top electrode 81', which may be sequentially formed. A gap between the ferroelectric layer patterns 79 and a gap between the bottom electrodes 77 may be filled with a first oxygen penetration path layer pattern 83*a*.

The entire surface of the semiconductor substrate 51 region including the common top electrode 81' may be covered with a stack layer including an oxygen penetration path layer 87 and an encapsulated barrier layer 89 to form an oxygen penetration path 88 through the oxygen penetration path layer 87 and the first oxygen penetration path layer pattern 83*a* to the ferroelectric layer patterns 79. The common plate line 99 contacts the common top electrode 81' through a slit-type common via-hole 97 extending through first and second top interlayer insulation layers 91 and 95, the encapsulated barrier layer 89, and the oxygen penetration path layer 87.

Further embodiments of the present invention will now be described with reference to FIG. 7. The embodiments of FIG. 7 differ from the embodiments described with reference to FIG. 5 in that the embodiments of FIG. 5 include an encapsulated barrier layer pattern 84*a*. Descriptions of like numbered items corresponding to the descriptions provided for FIGS. 2-6 above not pertinent to understanding the embodiments of FIG. 7 will not be further described with reference to FIG. 7.

Figure 7:
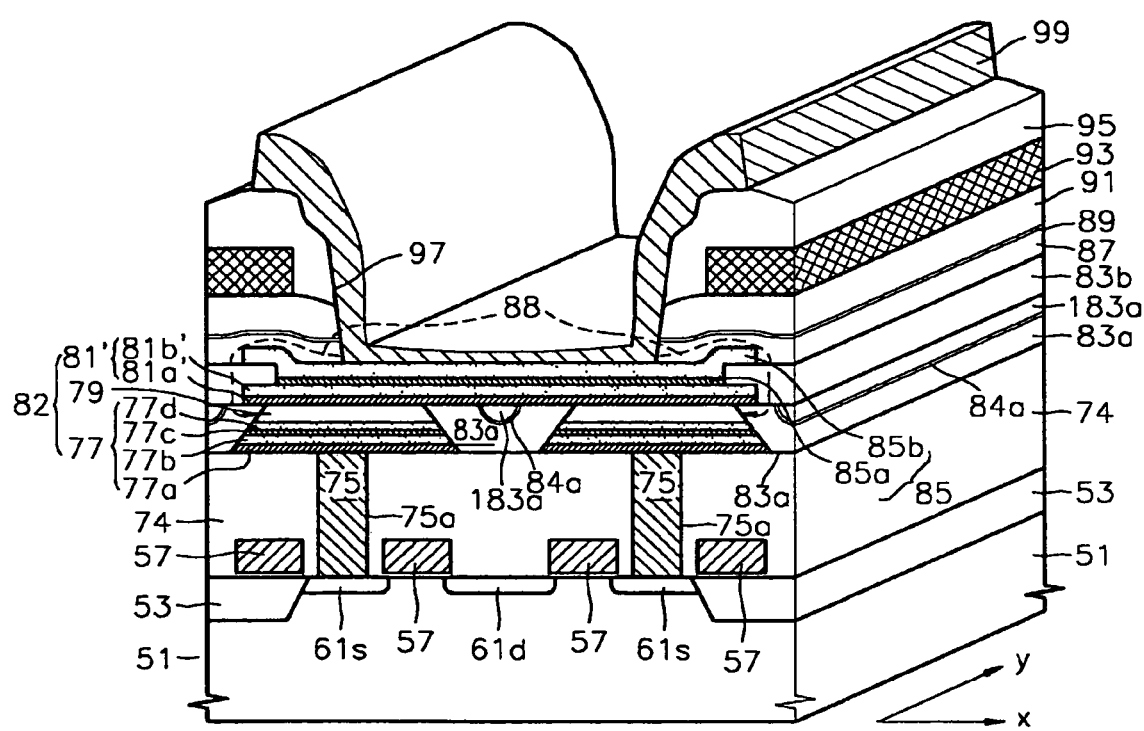

For the embodiments illustrated in FIG. 7, a gap between the ferroelectric layer patterns 79 and a gap between the bottom electrodes 77 are filled with a first oxygen penetration path layer pattern 83*a*, the encapsulated barrier layer 84*a*, and an insulation layer pattern 183*a*. The encapsulated barrier layer pattern 84*a* is formed on the first oxygen penetration path layer pattern 83*a* so that an oxygen penetration path 88 can be provided along the oxygen penetration path layer 87 covering local plate lines 85 and the second and first oxygen penetration path layer patterns 83*b* and 83*a*. The insulation layer pattern 183*a* may be formed of the same material as the first oxygen penetration path layer pattern 83*a*. The common plate line 99 contacts the local plate line 85 through the slit-type common via-hole 97 that extends through the first and second top interlayer insulation layers 91 and 95, the encapsulated barrier layer 89, and the oxygen penetration path layer 87.

Further embodiments of the present invention will now be described with reference to FIG. 8. The embodiments of FIG. 8 differ from the embodiments described with reference to FIG. 2 in that the embodiments of FIG. 8 have a common ferroelectric layer pattern 79' and a common top electrode 81' instead of having individual ferroelectric layer patterns and individual top electrodes for the individual capacitors 82. Cell transistors, underlying interlayer insulation layers and contact plugs are substantially the same as described for the like numbered items in FIGS. 2-7 and such aspects not pertinent to understanding the embodiments of FIG. 8 will not be further described with reference to FIG. 8.

Figure 8:
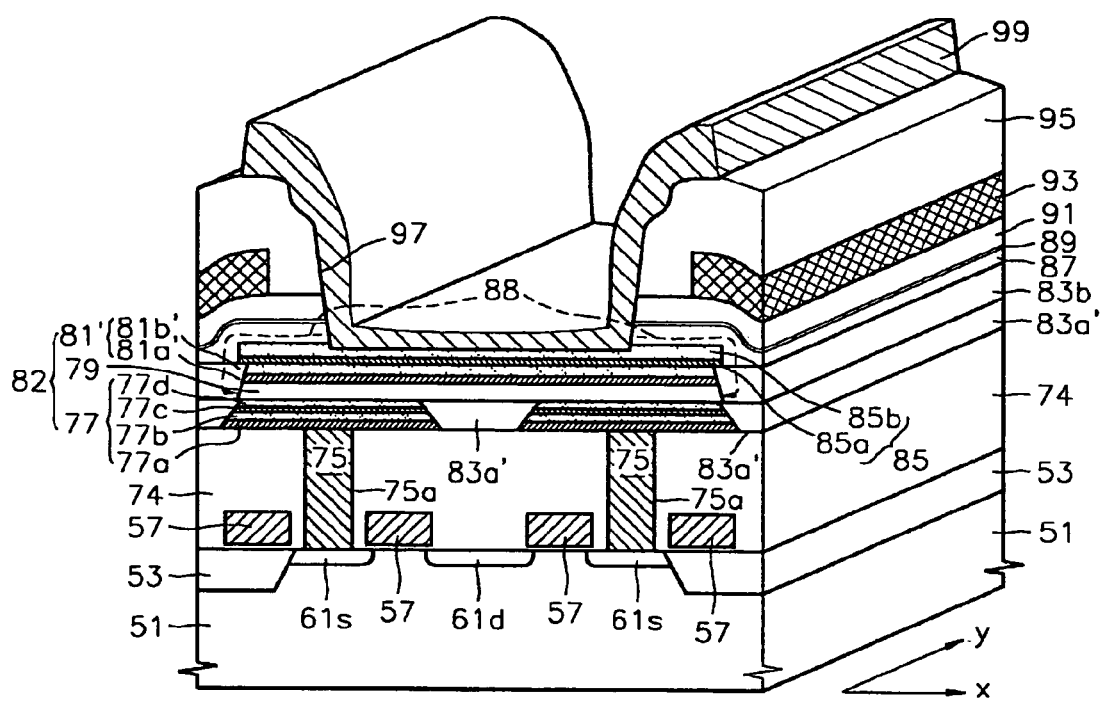

As shown in FIG. 1 and FIG. 8, for the embodiments illustrated in FIG. 8, the plurality of ferroelectric capacitors 82 may be two-dimensionally arranged in the row (y-axis) and column (x-axis) directions covering the contact plugs 75. Each of the ferroelectric capacitors may include a bottom electrode 77, the common ferroelectric layer pattern 79' and the common top electrode 81', which may be sequentially formed. The common ferroelectric layer pattern 79' extends to cover at least two adjacent rows of the bottom electrodes 77. In addition, the common top electrode 81' is deposited on the common ferroelectric layer pattern 79'. A gap between the bottom electrodes 77 may be filled with an insulation layer pattern 83a'. A gap between the common ferroelectric layer patterns 79' and a gap between the common top electrodes 81' may be-filled with an oxygen penetration path layer pattern 83b.

A local plate line 85 is formed on the common top electrode 81' and the common ferroelectric layer pattern 79', the common top electrode 81' and the local plate line 85 may be provide parallel to the row (y-axis) direction. The entire surface of the semiconductor substrate 51 in the region including the local plate lines 85 may be covered with a stack layer including an oxygen penetration path layer 87 and an encapsulated barrier layer 89. The oxygen penetration path 88 extends to the common ferroelectric layer pattern 79' along the oxygen penetration path layer 87 and the oxygen penetration path layer pattern 83b. When the insulation layer pattern 83a' filling the gap between the bottom electrodes 77 is formed of the same material as the oxygen penetration path layer pattern 83b, the oxygen penetration path 88 may be more readily provided for a subsequent recovering annealing process. The first and second top interlayer insulation layers 91 and 95, the main word lines 93, and the common plate line 99 may then have the same structure as described for like numbered items with reference to FIG. 2.

Further embodiments of the present invention will now be described with reference to FIG. 9. The embodiments of FIG. 9 differ from the embodiments described with reference to FIG. 8 in that, for the embodiments of FIG. 9, a local plate line is not provided and only a common plate line 99 is used. Descriptions of like numbered items corresponding to the descriptions provided for FIGS. 2-8 above not pertinent to understanding the embodiments of FIG. 9 will not be further described with reference to FIG. 9.

Figure 9:
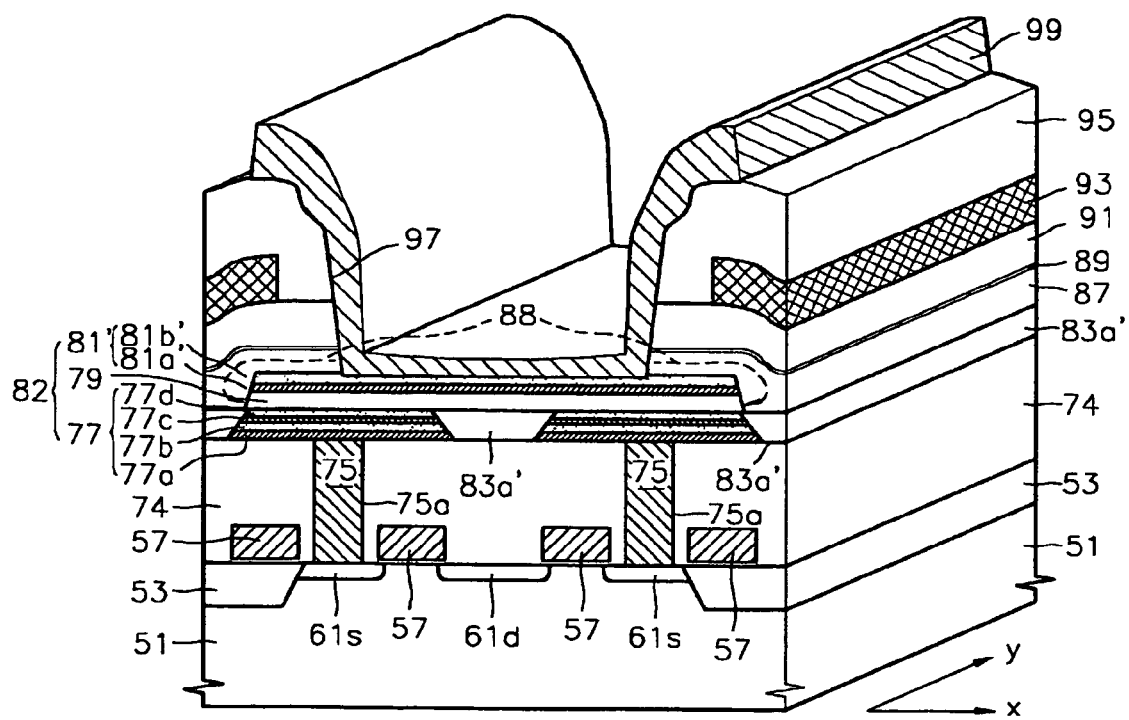

As shown in FIG. 1 and FIG. 9, for the embodiments illustrated in FIG. 9, the plurality of ferroelectric capacitors 82 may be two-dimensionally arranged in the row (y-axis) and column (x-axis) directions covering the contact plugs 75. A gap between the lower electrodes 77 may be filled with an insulation layer pattern 83a'. The entire surface of the semiconductor substrate 51 including the common ferroelectric layer pattern 79' and the common top electrode 81' may be covered with a stack layer including the oxygen penetration path layer 87 and the encapsulated barrier layer 89. The oxygen penetration path 88 extends to the common ferroelectric layer pattern 79' through the oxygen penetration path layer 87 without needing to pass through any other formed oxygen penetration layers. The common plate line 99 is electrically connected to the common top electrode 81' of capacitors 82 through the slit-type common via-hole 97, which extends through the first and second top interlayer insulation layers 91 and 95, the encapsulated barrier layer 89, and the oxygen penetration path layer 87.

Further embodiments of the present invention will now be described with reference to FIG. 10. The embodiments of FIG. 10 differ from the embodiments described with reference to FIG. 8 in that the embodiments of FIG. 10 include the encapsulated barrier layer pattern 84a. Descriptions of the same elements as those in the second embodiment will be omitted. Descriptions of like numbered items corresponding to the descriptions provided for FIGS. 2-9 above not pertinent to understanding the embodiments of FIG. 10 will not be further described with reference to FIG. 10.

Figure 10:
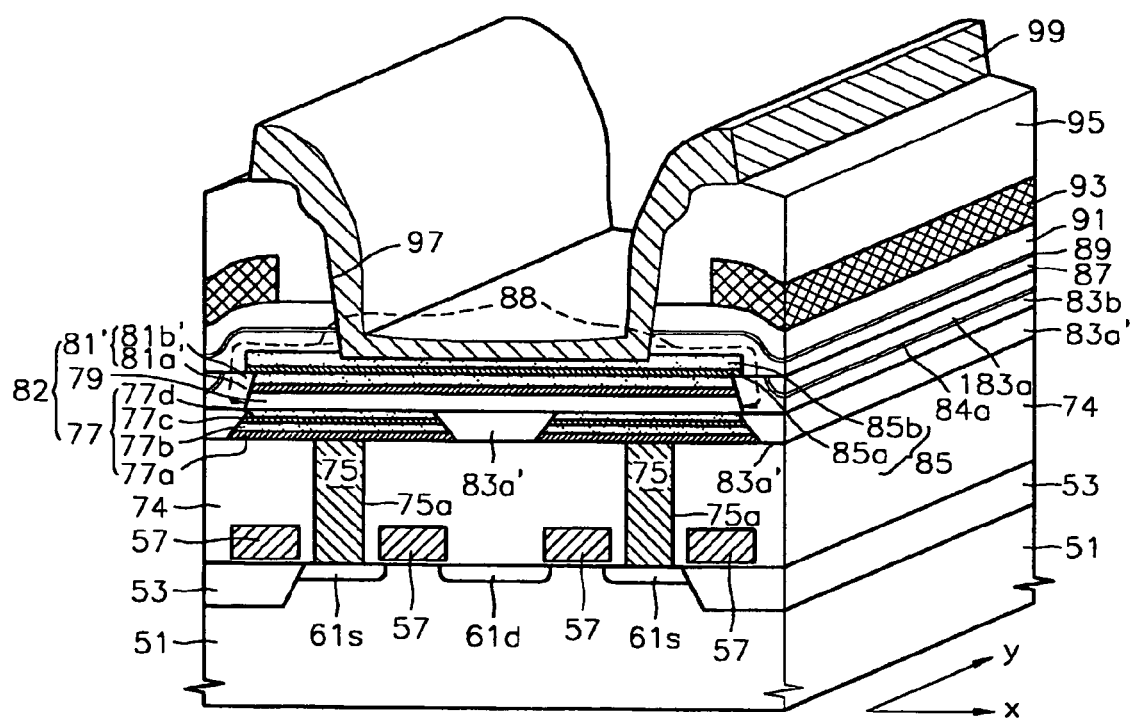

As shown in FIG. 1 and FIG. 10, for the embodiments illustrated in FIG. 10, the plurality of ferroelectric capacitors 82 may be two-dimensionally arranged in the row (y-axis) and column (x-axis) directions covering the contact plugs 75. A gap between the lower electrodes 77 may be filled with an insulation layer pattern 83a'. A gap between the common ferroelectric layer patterns 79' and a gap between the common top electrodes 81' may be filled with the oxygen penetration path layer pattern 83b, the encapsulated barrier layer pattern 84a, and the insulation layer pattern 183a. The encapsulated barrier layer pattern 84a may be patterned to allow forming of the oxygen penetration path 88 through the oxygen penetration path layer 87 covering the local plate lines 85 to the oxygen layer pattern 83b. The insulation layer pattern 183a may be formed of the same material as the oxygen penetration path layer pattern 83b. The common plate line 99 is electrically connected to the local plate line 85 through the slit-type common via-hole 97, which extends through the first and second top interlayer insulation layers 91 and 95, the encapsulated barrier layer 89, and the oxygen penetration path layer 87.

Embodiments of methods of fabricating ferroelectric integrated circuit devices, such as memory devices, according to the present invention will now be described with reference to FIGS. 11-41. FIGS. 11-24 are cross-sectional diagrams illustrating methods of fabricating ferroelectric integrated circuit devices according to first embodiments of the present invention with alternative embodiments being further illustrated in FIGS. 25-41. The cross-sectional diagrams of FIGS. 11-41 may best be understood as being generally taken along the line I-I' of FIG. 1. To simplify understanding of the present disclosure, the description of the various embodiments of the methods of the present invention will all be presented in the context of a memory device but may be applied to other ferroelectric integrated circuit devices.

Figure 11:
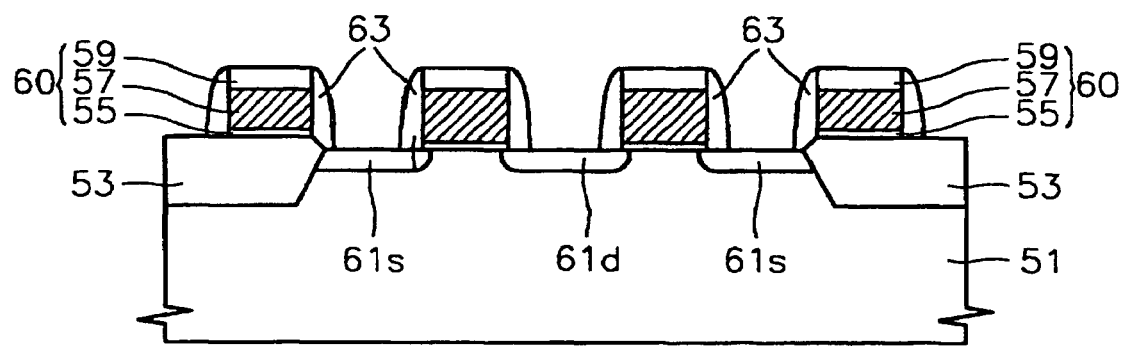
FIGS. 11-24 are cross-sectional diagrams illustrating methods of fabricating ferroelectric integrated circuit devices according to embodiments of the present invention, taken along the line. I-I' of FIG. 1.

Referring now to FIG. 11, a device isolation layer 53 is formed in a selected region of an integrated circuit (semiconductor) substrate 51 to define the plurality of active regions 53a as illustrated, for example, in FIG. 1. A gate insulation layer, a gate conductive layer, and a capping insulation layer may be sequentially formed on the entire surface of the semiconductor substrate 51 in a region including the active regions 53a before patterning operations to provide the structure shown in FIG. 11. The capping insulation layer, the gate conductive layer, and the gate insulation layer are patterned to form a plurality of parallel gate patterns 60 crossing the top surfaces of the active regions 53a and the device isolation layer 53. Each of the gate patterns 60 may include a gate insulation layer pattern 55, a gate electrode 57, and a capping insulation layer pattern 59, which may be sequentially stacked. The active regions 53a cross a pair of gate electrodes 57. For the memory device illustrated in the Figures, the gate electrodes 57 may be word lines.

Impurity ions are implanted into the active regions 53a using the gate patterns 60 and the device isolation layer 53 as ion-implantation masks to form three impurity regions in each of the active regions 53a. As shown in the memory device of FIG. 11, the middle impurity region is a common drain region 61d and the remaining impurity regions are source regions 61s for respective memory cells. Thus, two cell transistors may be formed in each of the active regions 53a. The cell transistors may be two-dimensionally arranged in row and column directions of the integrated circuit (semiconductor) substrate 51. Spacers 63 may also be formed on the sidewalls of the gate patterns 60 using conventional methods.

Figure 12:
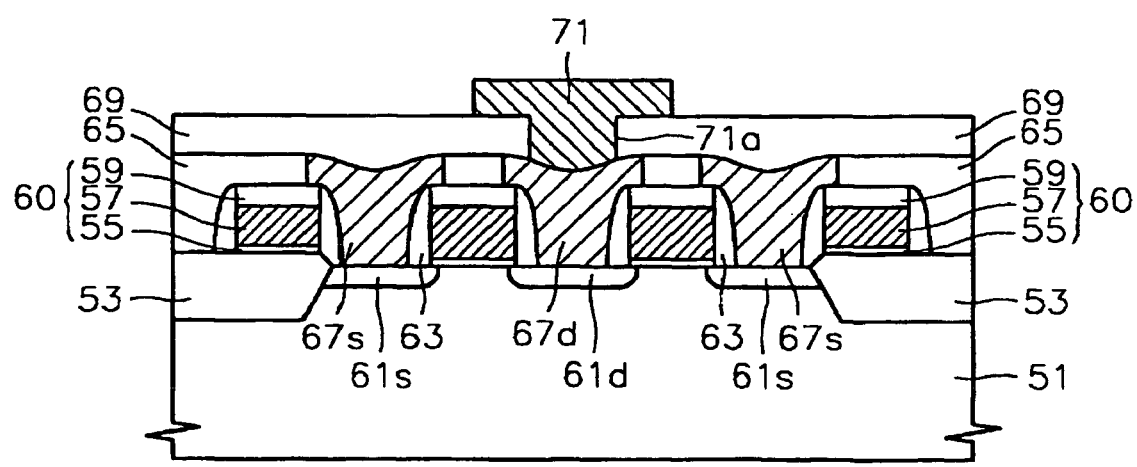

Further steps in forming a ferroelectric memory device according to embodiments of the present invention will now be described with reference to FIG. 12. As shown in the embodiments of FIG. 12, a first underlying interlayer insulation layer 65 is formed on the surface of the semiconductor substrate 51 in the region including the spacers 63. The first underlying interlayer insulation layer 65 is patterned to forming pad contact holes exposing the source and common drain regions 61s and 61d. Storage node pads 67s and bit line pads 67d may be formed in the pad contact holes using conventional methods. The storage node pads 67s contact the source regions 61s, and the bit line pads 67d contact the common drain regions 61d. A second underlying interlayer insulation layer 69 is formed on the surface of the semiconductor substrate 51 in the region of the pads 67s and 67d. The second underlying interlayer insulation layer 69 is patterned to form bit line contact holes 71a exposing the bit line pads 67d. A plurality of parallel bit lines 71 covering the bit line contact holes 71a are forned. The bit lines 71 cross the tops of the word lines 57. A single bit line 71 is illustrated in FIG. 12, which is not shown as extending across the width of the illustrated portion of the memory device as the cross-section is taken generally along the line I-I' of FIG. 1.

Figure 13:
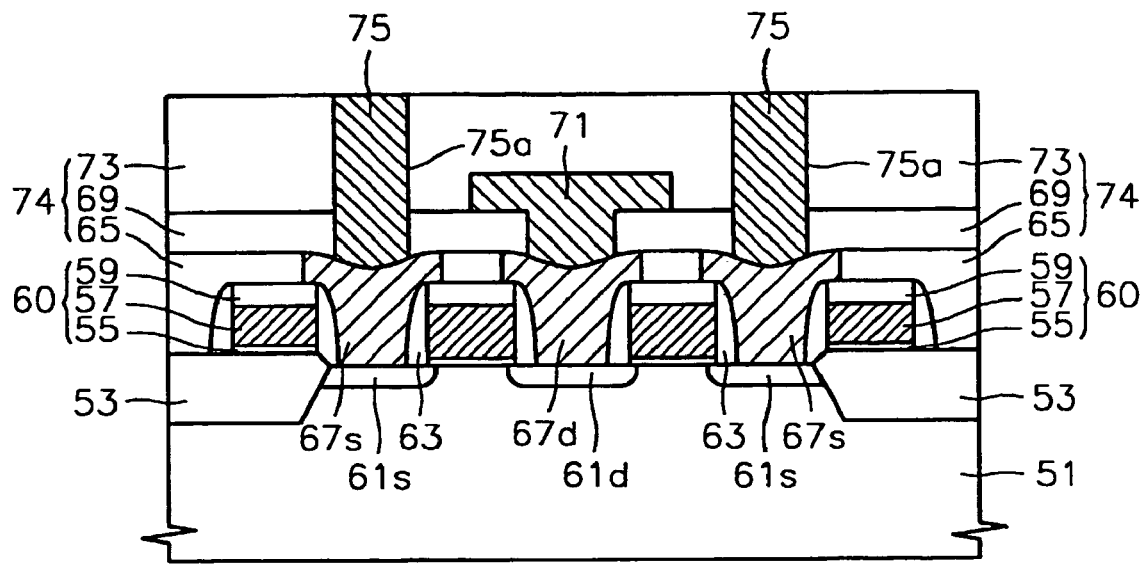

Referring now to FIG. 13, a third underlying interlayer insulation layer 73 is formed on the surface of the semiconductor substrate 51 in the region of the bit lines 71. The first through third underlying interlayer insulation layers 65, 69, and 73 are generally referred to herein as an underlying interlayer insulation layer 74. However, more or less layers may be included in the underlying interlayer insulation layer 74 in various embodiments of the present invention. After deposition, the second and third underlying interlayer insulation layers 69 and 73 are patterned to form storage node contact holes 75a that expose the storage node pads 67s. Contact plugs 75 are formed in the storage node contact holes 75a.

Figure 14:
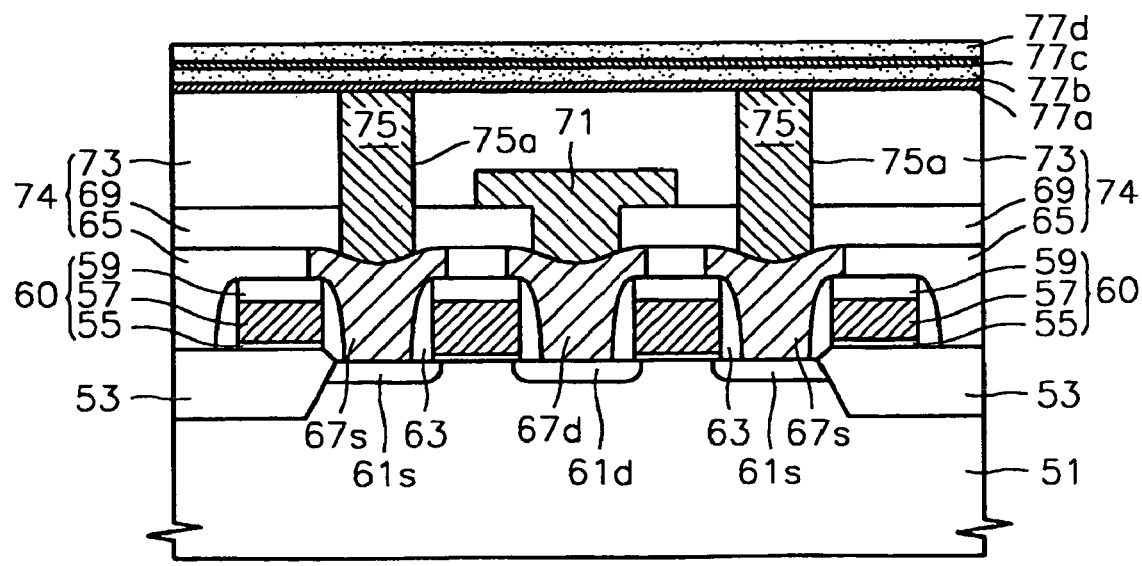

As shown in the embodiments of FIG. 14, a multi-layer bottom electrode layer is formed from an adhesive layer 77a, a bottom diffusion preventing layer 77b, a bottom metal oxide layer 77c and a bottom metal layer 77d. The bottom electrode layer is formed on and electrically contacting the top end of the contact plugs 75 and on the underlying interlayer insulation layer 74. The adhesive layer 77a is deposited on the surface of the semiconductor substrate 51 in the region including the contact plugs 75 and the underlying interlayer insulation layer 74. The adhesive layer 77a may facilitate good ohmic contact between a bottom electrode and the contact plugs 75. For example, the adhesive layer 77a may be formed of a titanium (Ti) layer, which can be deposited, for example, by sputtering. However, it is to be understood that no adhesive layer 77a is included in some embodiments of the present invention.

The bottom diffusion preventing layer 77b is formed on top of the adhesive layer 77a and may be used to prevent or limit oxygen from diffusing to the contact plugs 75. If no adhesive layer 77a is used, the bottom diffusion preventing layer 77b may also be selected to provide ohmic contact with the contact plugs 75. The bottom diffusion preventing layer 77b may be formed of a durable metal such as iridium (Ir), rhenium (Re), ruthenium (Ru), or rhodium (Rh) by, for example, direct current (DC) magnetron sputtering. Iridium may be particularly beneficial in preventing diffusion of oxygen to the contact plugs 75. Because iridium generally has a lower oxygen permeability than ruthenium or rhodium, it may provide a desireable diffusion barrier characteristic.

The bottom metal oxide layer 77c may be formed on the top of the bottom diffusion preventing layer 77b. The bottom metal oxide layer 77c may be formed of a metal oxide layer to provide good conductivity, for example, a noble metal oxide layer such as an iridium oxide ($IrO_2$) layer, a rhenium oxide ($ReO_2$) layer, a ruthenium oxide ($RuO_2$) layer, or a rhodium oxide ($RhO_2$) layer. The bottom metal oxide layer 77c may be deposited by, for example, a DC magnetron sputtering method. In addition, the bottom metal oxide layer 77c may be stabilized by being heat treated in an oxygen atmosphere after deposition. For example, a rapid thermal anneal (RTA) process may be performed at a temperature of about 550° C. The bottom metal oxide layer 77c may compensate for oxygen vacancies that could occur in the interface region between the bottom electrode and a ferroelectric layer formed on the bottom electrode. As a result of compensating for such oxygen vacancies using the bottom metal oxide layer 77c, the read and write characteristics of the resulting ferroelectric memory device may be improved. An iridium oxide layer in an unstable state may be particularly beneficial for the bottom metal oxide layer 77c.

The bottom metal layer 77d is formed on the bottom metal oxide layer 77c and may secure/facilitate crystalline growth of a later deposited ferroelectric layer described below. The bottom metal layer 77d may facilitate crystalline growth by inducing interface lattice matching based on the dependency of the ferroelectric layer on its underlying layer. Significant interface lattice mismatching between the bottom metal layer 77d and the later deposited ferroelectric, an undesirable interface state may arise from instability of the interface. In particular, a trap state may result from a difference in a work function between the materials of the ferroelectric layer and the underlying layer on which it is deposited leading to unstable bonding (i.e., dangling bonds) between atoms in the interface. Such an interface state may cause space-charges to be generated and the space-charges may counterbalance nonvolatile remnant polarization by dipole(s). This condition may cause degradation of a performance characteristic of the resultant memory device as manufactured or over time.

In order to prevent/limit formation of space-charges in the interface, the bottom metal layer 77d may be formed of material selected to achieve smooth interface lattice matching with the ferroelectric layer. For example, when the ferroelectric layer is a PZT layer, the bottom metal layer 77d may be a platinum (Pt) layer. As platinum generally has a similar lattice parameter as ferroelectric substances, particularly PZT, and generally has a similar crystal lattice structure, i.e., face center cubic (FCC) to PZT, excellent interface lattice matching may be provided when a PZT layer is formed on a platinum layer. In addition, platinum generally has a high work function (of about 5.4-5.7 eV), so a difference in a work function value with the ferroelectric substance can be minimized, which may minimize the generation of an undesirable interface state.

Figure 15:
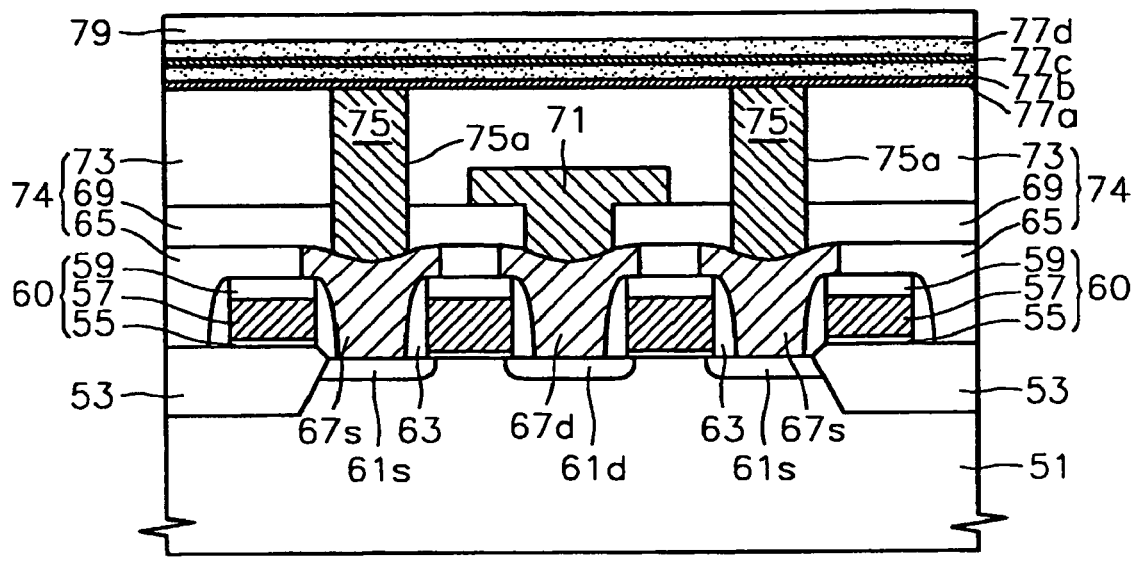

As shown in FIG. 15, a ferroelectric layer 79 is formed on the bottom electrode layer 77 by depositing a ferroelectric material, for example, a ferroelectric material in the SBT or PZT family, using, for example, a sol-gel method, a sputtering method and/or a chemical vapor deposition (CVD) method.

Ferroelectric substance in the PZT family generally have a larger remnant polarization value than ferroelectric substance in an SBT family, by about 30 mC/cm2. The PZT family materials generally also have a deposition temperature of about 600° C. to about 700° C. Thus, the deposition process may also have less impact on the characteristics of the underlying cell transistors than deposition of a ferroelectric material in the SBT family. After the ferroelectric layer 79 is formed, is may be crystallized. For example, heat treatment may be performed in RTA or furnace equipment in an oxygen atmosphere at a temperature of about 700° C. to crystallize the ferroelectric layer 79.

Figure 16:
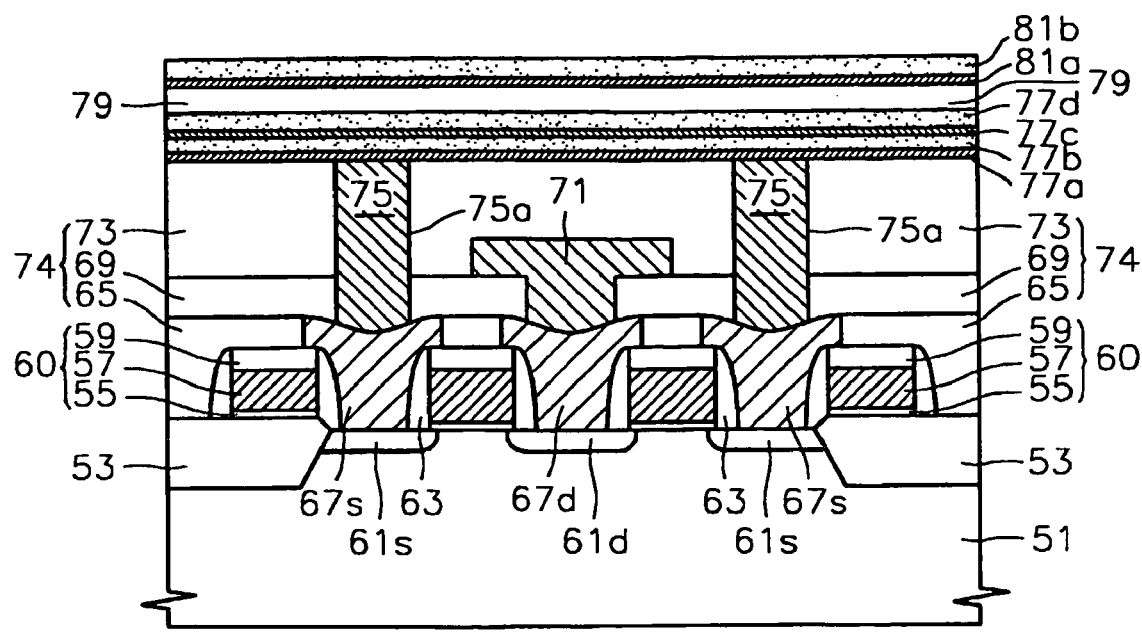

Referring now to FIG. 16, a top metal oxide layer 81a and a top diffusion preventing layer 81b may be sequentially formed on the ferroelectric layer 79. The top metal oxide layer 81a, like the bottom metal oxide layer 77c, may be a material selected to improve read and write characteristics of the resulting memory device. In particular, to help compensate for oxygen vacancies that may occur in the interface region with the ferroelectric layer 79, the top metal oxide layer 81a, like the bottom metal oxide layer 77c, may be a noble metal oxide such as rhenium oxide, ruthenium oxide, rhodium oxide and/or iridium oxide. Iridium oxide may be particularly beneficial for this purpose. After deposition of the top metal oxide layer 81a, it may be stabilized by annealing in an oxygen atmosphere.

As with the bottom diffusion preventing layer 77b, the top diffusion preventing layer 81b may be a noble metal such as iridium, rhenium, rhodium, or ruthenium. Iridium may be a particularly beneficial material for the top diffusion preventing layer 81b. Optionally, a top metal layer may also be formed on the surface of the ferroelectric layer 79 before the top metal oxide layer 81a is formed to induce interface lattice matching. As with the bottom electrode, such interface lattice matching may suppress an undesirable interface state and reduce the risk of memory degradation from space-charges.

Figure 17:
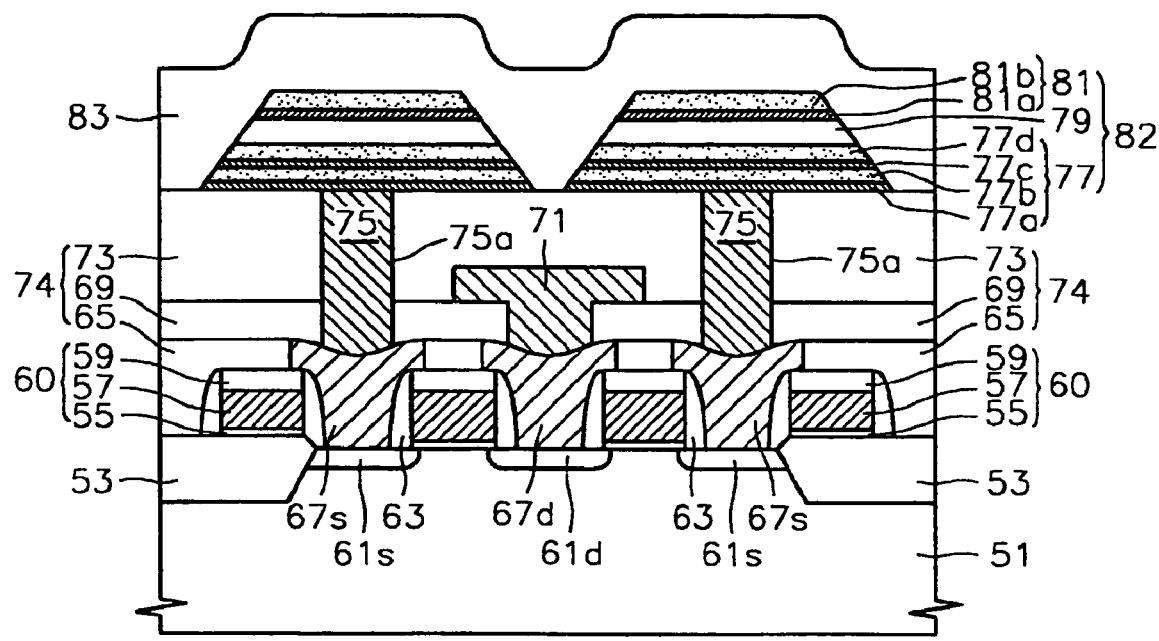

As shown in FIG. 17, the top electrode layer 81, including the top metal oxide layer 81a and the top diffusion preventing layer 81b, the ferroelectric layer 79, and the bottom electrode layer 77 are patterned to form a plurality of ferroelectric capacitors 82, which may be two-dimensionally arranged in the row and column directions. As the bottom electrodes 77 of the ferroelectric capacitors 82 contact the contact plugs 75, each of the ferroelectric capacitors 82 is electrically connected to an associated source region 61s of its underlying cell transistor. An oxygen penetration path layer 83 is formed on the surface of the structure in the region including the ferroelectric capacitors 82. The oxygen penetration path layer 83 may be formed, for example, as a silicon oxide (SiO2) layer or a titanium oxide (TiO2) layer that can be penetrated by oxygen.

Figure 18:
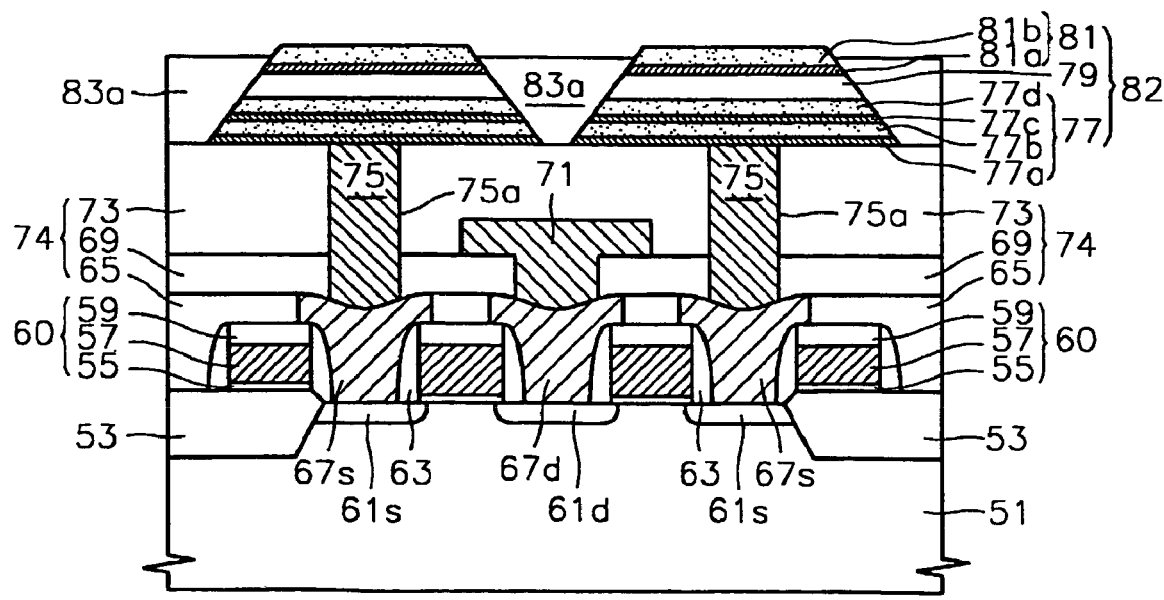

Referring now to FIG. 18, the oxygen penetration path layer 83 is planarized, for example, by an etch-back process, to expose the top electrode 81. In accordance with various embodiments of the present invention, after etching, a gap between the capacitors 82 remains filled with an oxygen penetration path layer pattern 83a.

Figure 19:
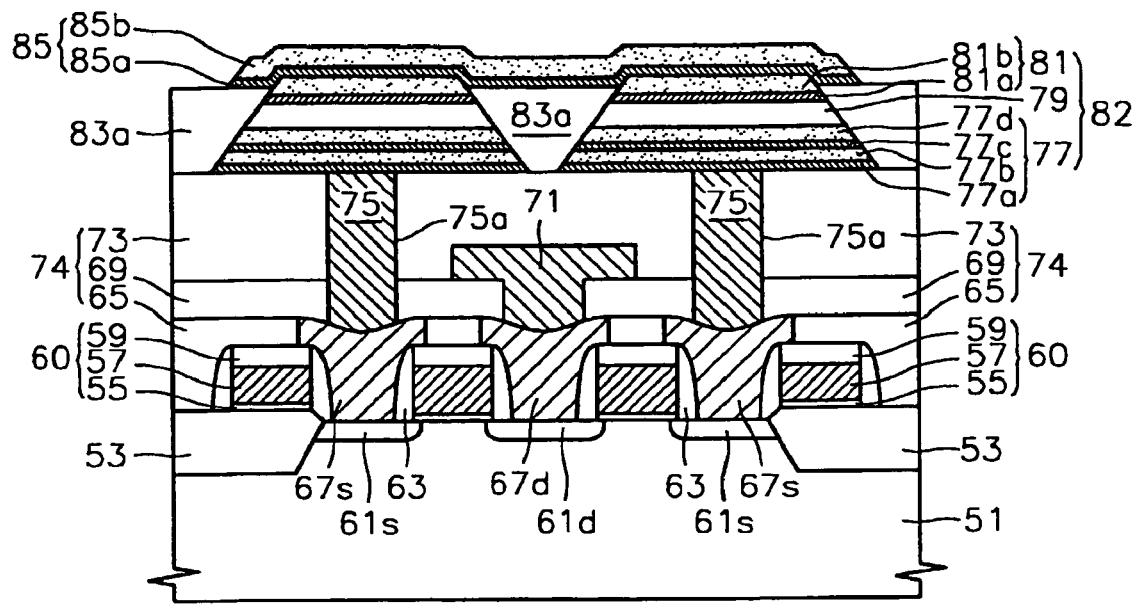

For embodiments including local plate lines, as shown in FIG. 19, a metal oxide layer 85a and a diffusion preventing layer 85b are sequentially formed on the surface of the semiconductor substrate in a region including the oxygen penetration path layer pattern 83a, in a manner similar to that described for the top electrode 81. The laers 85a, 85b are patterned to form a plurality of local plate lines 85, which may be parallel to the word lines 57. The local plate lines 85 are, in such embodiments, parallel to the row direction (the y-axis of FIG. 1). Each of the local plate lines 85 may directly contact a plurality of top electrodes 81 arranged in two adjacent rows.

Figure 20:
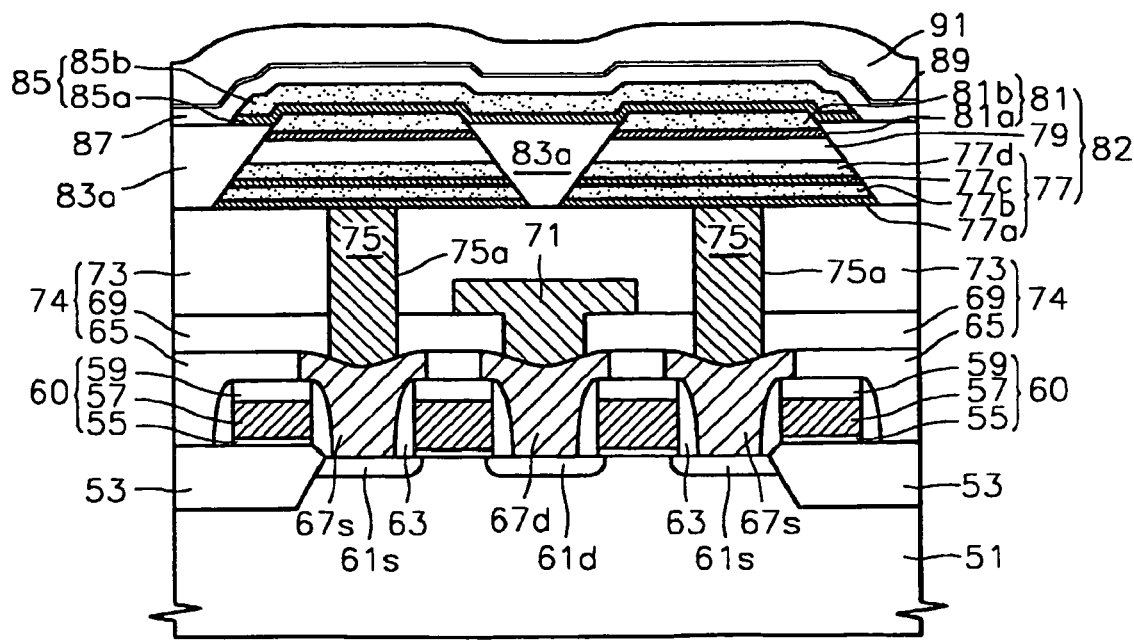

Referring now to FIG. 20, an oxygen penetration path layer 87 is formed on the surface of the semiconductor substrate 51 in the region including the local plate lines 85. The oxygen penetration path layer 87 may be the same material as the oxygen penetration path layer pattern 83a. The oxygen penetration path layer 87 may be formed, for example, by an atomic layer deposition method, a plasma enhanced CVD method, or an atmospheric pressure or low-pressure CVD method, to a thickness allowing oxygen to effectively penetrate during a recovery annealing process occurring subsequently during the fabrication of the memory device.

A barrier layer that provides a barrier to flow of oxygen and/or other gases, such as the encapsulated barrier layer 89, is formed on the oxygen penetration path layer 87. The encapsulated barrier layer 89 may be a metal oxide layer, for example, an aluminum oxide ($Al_2O_3$) layer, a titanium oxide ($TiO_2$) layer, a zirconium oxide ($ZrO_2$) layer, or a cesium oxide ($CeO_2$) layer, and may be formed, for example, using an atomic layer deposition method, a plasma enhanced CVD method, or an atmospheric pressure or low-pressure CVD method. In particular embodiments of the present invention a double layer structure is provided as the encapsulated barrier layer 89. For example, a metal oxide layer may be formed initially to a first thickness, below the desired total thickness of the encapsulated barrier layer 89, and then heat-treated. Another metal oxide layer may then be formed on the initial heat treated metalioxide layer up to the desired thickness of the encapsulated barrier layer 89. Such a double layer structure may enhance a barrier characteristic of the encapsulated barrier layer 89. The encapsulated barrier layer 89 may be formed on the entire surface of the semiconductor substrate 51 to indirectly cover the ferroelectric capacitors 82. An oxygen penetration path, including the oxygen penetration path layer 87 and the oxygen penetration path layer pattern 83a, is being interposed between the ferroelectric capacitors 82 and further structures formed on the semiconductor substrate, including the encapsulated barrier layer 89.

An encapsulated barrier layer 89 may be beneficial during fabrication of the memory device. For example, during a backend integration process (e.g., ILD, IMD, or passivation layer forming processes) after the ferroelectric capacitors 82 are formed, flow of a carrier gas, for example, a hydrogen gas, can be limited or even prevented from penetrating to the underlying ferroelectric capacitors 82. If such gas flow is not limited, hydrogen atoms may be implanted into the ferroelectric capacitors 82 and characteristics of the ferroelectric capacitors 82, such as a polarization characteristic and/or a leakage current characteristic, may be degraded. Thus, use of the encapsulated barrier layer 89 may improve the performance characteristics of the ferroelectric capacitors 82. Thus, the encapsulated barrier layer 89 may be formed to have a sufficient thickness to limit or even prevent such diffusion of a carrier gas. For example, the encapsulated barrier layer 89 may be formed to a thickness of about 50 Å to about 200 Å. In particular embodiments of the present invention, the encapsulated barrier layer 89 has a thickness of about 100 Å. Further structures, such as a first top interlayer insulation layer 91, may be formed on the encapsulated barrier layer 89.

Figure 21:
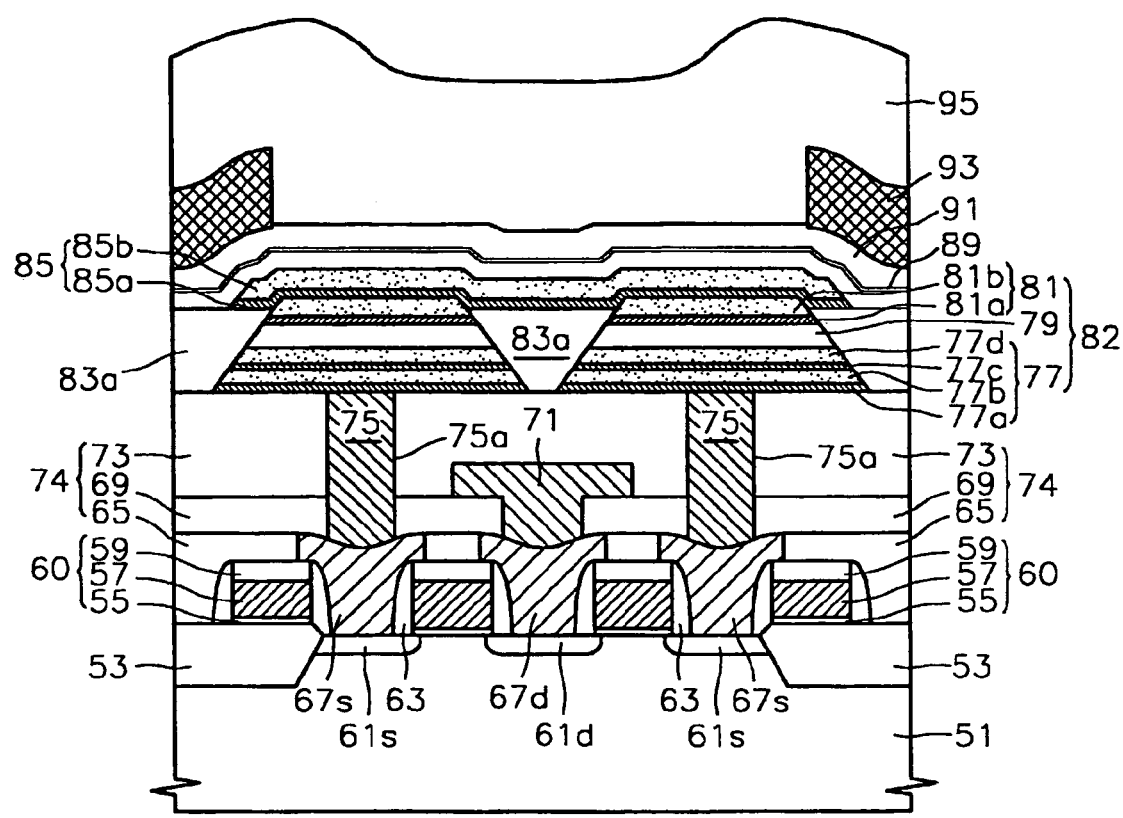

Referring now to FIG. 21, a plurality of parallel main word lines 93 may be formed on the first top interlayer insulation layer 91. In a typical memory device, each of the main word lines 93 may control four word lines 57 through a decoder. A second top interlayer insulation layer 95 may be formed on the surface of the semiconductor substrate 51 including the main word lines 93. The second top interlayer insulation layer 95 may be an insulation layer having good fluidity, for example, a silicate glass layer formed of boro phosphor silicate glass (BPSG) and/or phospho silicate glass (PSG).

Figure 22:
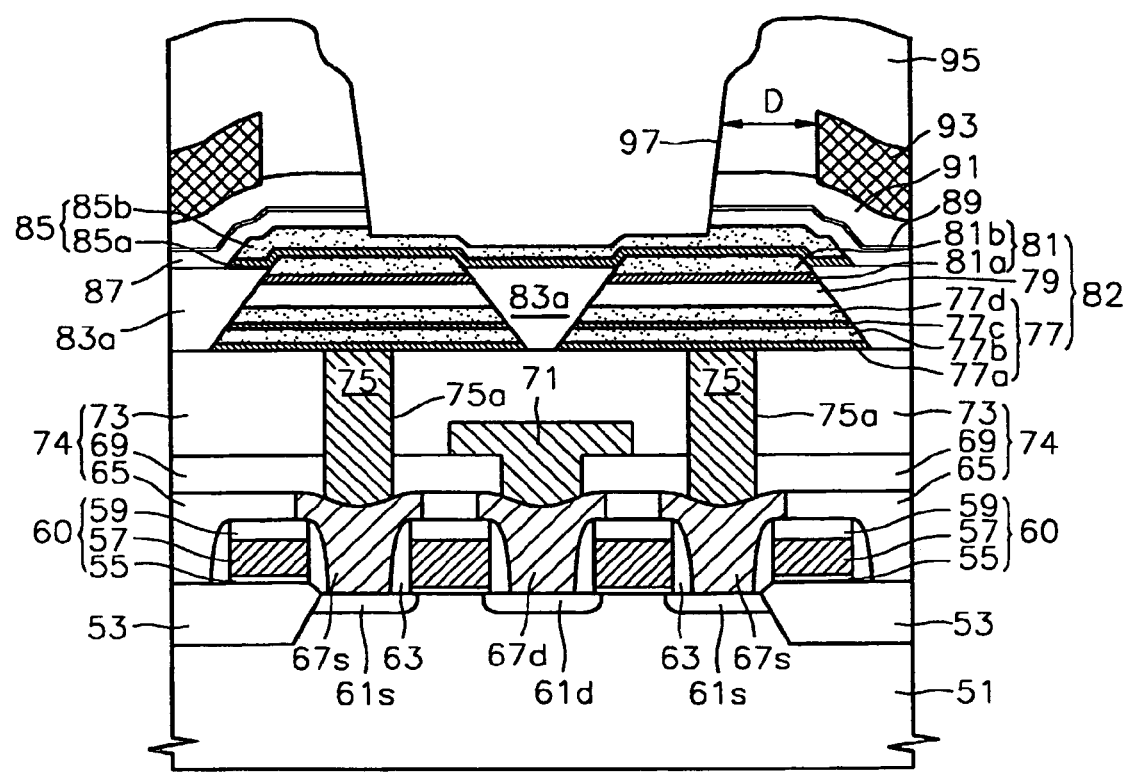

As shown in FIG. 22, photolithography may be used on the first and second top interlayer insulation layers 91 and 95 to form a slit-type common via-hole 97 exposing the local plate line 85. During photolithography, the local plate line 85 may function as an etch stopping layer. The slit-type common via hole 97 may be formed between and parallel to the main word lines 93. For such embodiments, the slit-type common via-hole 97 may be formed to expose a local plate line 85 that extends across at least two adjacent rows of capacitors 82. Therefore, the common via hole 97 may have a relatively large width, while still maintaining a reasonably wide distance D from adjacent main word lines 93, which may increase the photolithography margin in forming the common via-hole 97 (as contrasted with a conventional one per cell via hole). As a result, the aspect ratio of the slit-type common via-hole 95 can be reduced without exposing the main word lines 93, while still maximizing the exposed area of the local plate line 85. Accordingly, in various embodiments of the present invention, the integration density of a resulting ferroelectric memory device may be increased and the reliability of the ferroelectric memory device can also be increased.

Figure 23:
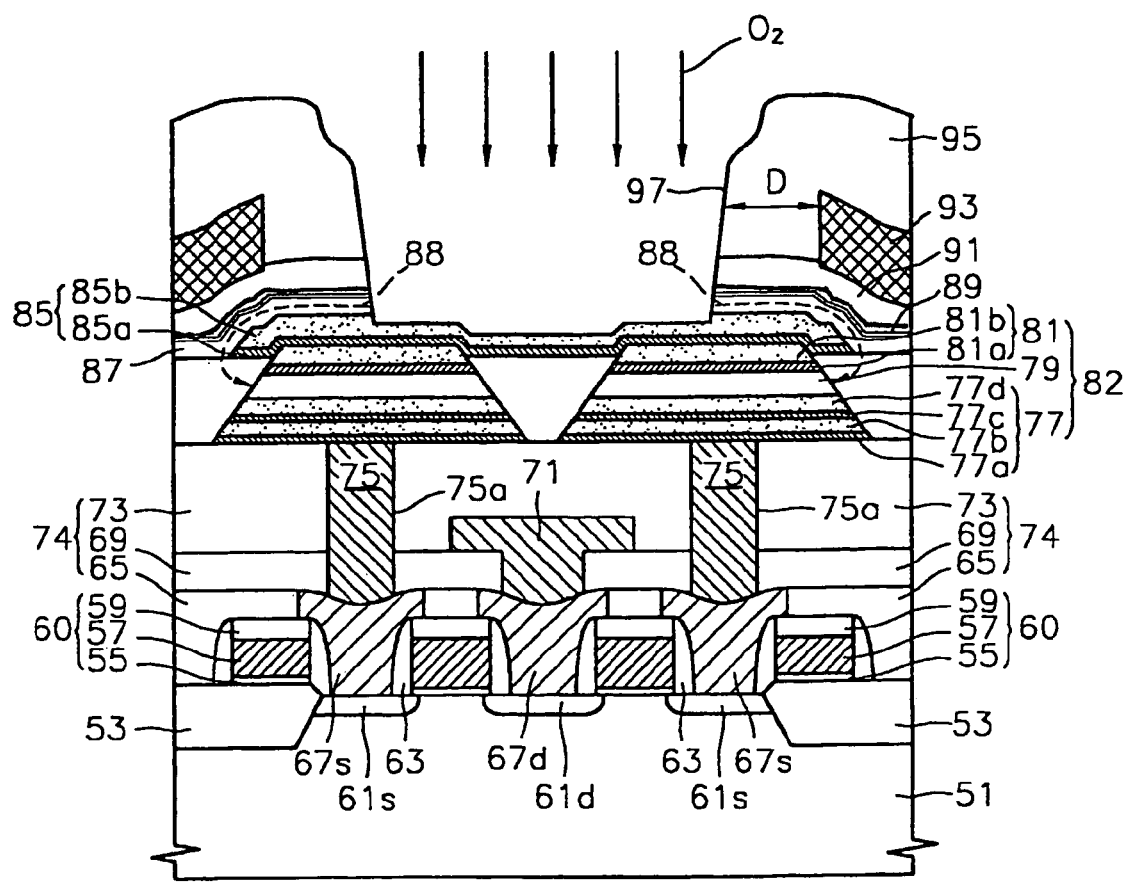

Referring now to FIG. 23, a recovery annealing process may be performed to reduce/cure oxygen vacancies that may have occurred in the ferroelectric layer 79 during formation of the ferroelectric capacitor or subsequent backend integration process(es). The recovery annealing process may be performed in RTA or furnace equipment in an oxygen atmosphere. The annealing may be performed at a temperature of about 450° C. to about 550° C. for about 1 to about 60 minutes to cure oxygen vacancies in the ferroelectric layer 79. During the recovery annealing process, oxygen is supplied to the ferroelectric layer 79 through the slit-type common via-hole 97 and along the oxygen penetration path 88 extending through the oxygen penetration path layer 87 and the oxygen penetration path layer pattern 83a to allow curing of oxygen vacancies in the ferroelectric layer 79.

Figure 24:
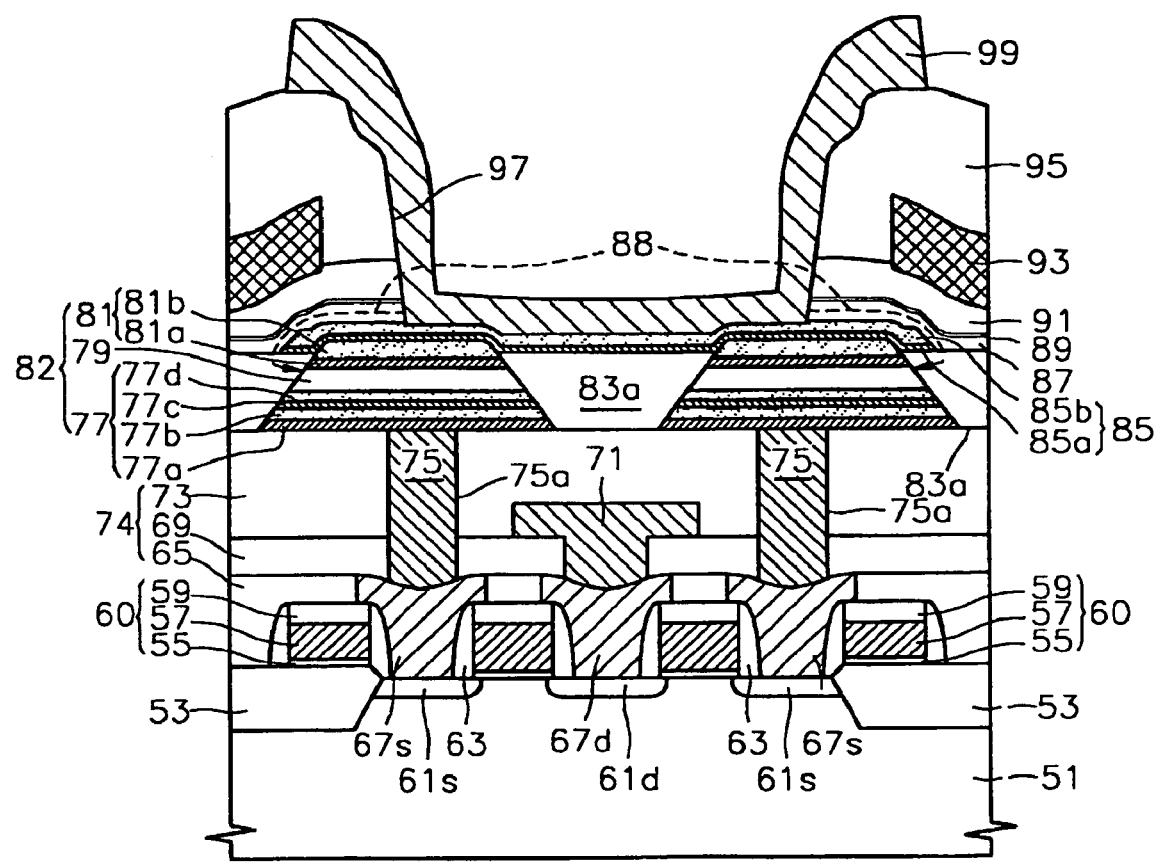

As shown in FIG. 24, for embodiments of the present invention including a common plate line, a metal layer may be formed on the surface of the semiconductor substrate 51 in a region including the slit-type common via-hole 97. As the aspect ratio of the slit-type common via-hole 97 may be low as described above, the metal layer may be deposited with good step coverage. The metal layer is then patterned to form a common plate line 99 covering the slit-type common via-hole 97. Thus, the operations as described with reference to FIGS. 11-24 provide a structure generally corresponding to the embodiments illustrated in FIG. 2. Methods related to manufacturing other illustrated embodiments will now be described with reference to FIGS. 25-41 to illustrate differences in methods for particular embodiments.

Figure 25:
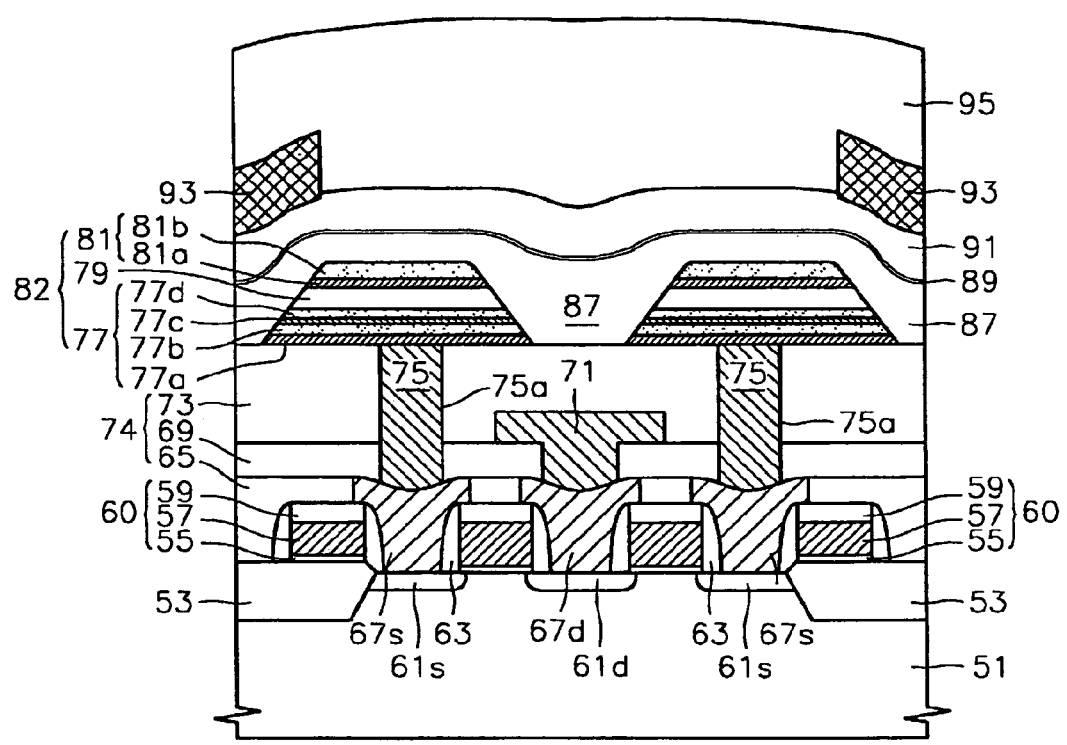
FIGS. 25 and 26 are cross-sectional diagrams illustrating methods of fabricating ferroelectric integrated circuit devices according to further embodiments of the present invention, taken along the line I-I' of FIG. 1.
Figure 26:
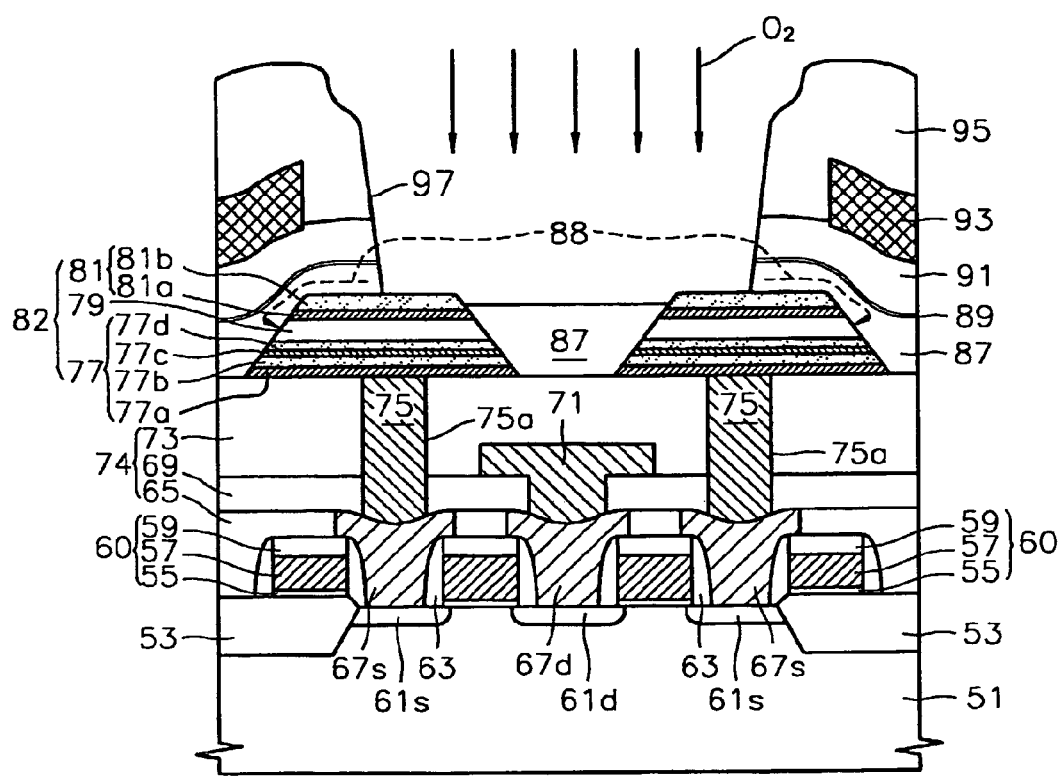

FIGS. 25 and 26 illustrate methods for fabricating a ferroelectric memory device generally corresponding to the embodiments of the present invention shown in FIG. 3. More particularly, the local plate line 85 is omitted in the operations of FIGS. 25 and 26. Operations through formation of the ferroelectric capacitors 82 are substantially the same as described with reference to FIGS. 11-24 and will not be further described. Referring to FIG. 25, the oxygen penetration path layer 87, the encapsulated barrier layer 89 and the first top interlayer insulation layer 91 are sequentially formed on the surface of a semiconductor substrate 51 in the region including the ferroelectric capacitors 82. A plurality of parallel main word lines 93 and a second top interlayer insulation layer 95 are formed on the first top interlayer insulation layer 91 as described with reference to the previous embodiments.

As shown in FIG. 26, the second and first top interlayer insulation layers 95 and 91, the encapsulated barrier layer 89, and the oxygen penetration path layer 87 may be sequentially patterned to form the slit-type common via-hole 97, thus exposing the top electrodes 81 of at least two adjacent rows of ferroelectric capacitors 82. During formation of the slit-type common via-hole 97, the upper surface of the top electrodes 81 may be used as etch stops. Recovery annealing operations may then be performed as described above. For the embodiments illustrated in FIG. 26, oxygen may be supplied to ferroelectric layer patterns 79 through an oxygen penetration path 88 extending through the oxygen penetration path layer 87 at the sidewalls of the slit-type common via-hole 97. Common plate lines 99 may be formed in the same manner as described for the embodiments above.

Figure 27:
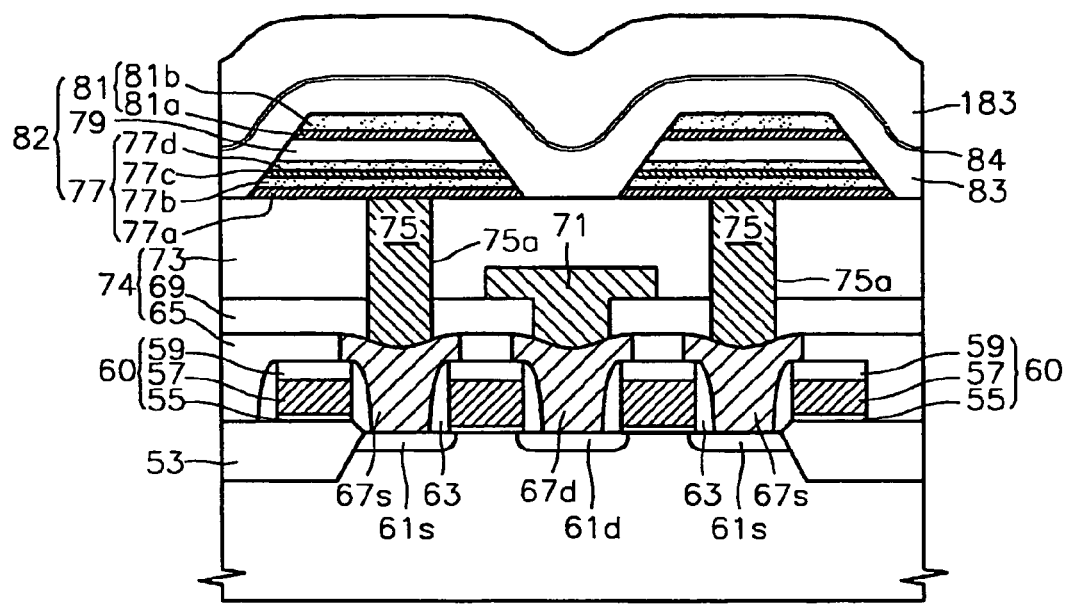
FIGS. 27 and 28 are cross-sectional diagrams illustrating methods of fabricating ferroelectric integrated circuit devices according to further embodiments of the present invention, taken along the line I-I' of FIG. 1.
Figure 28:
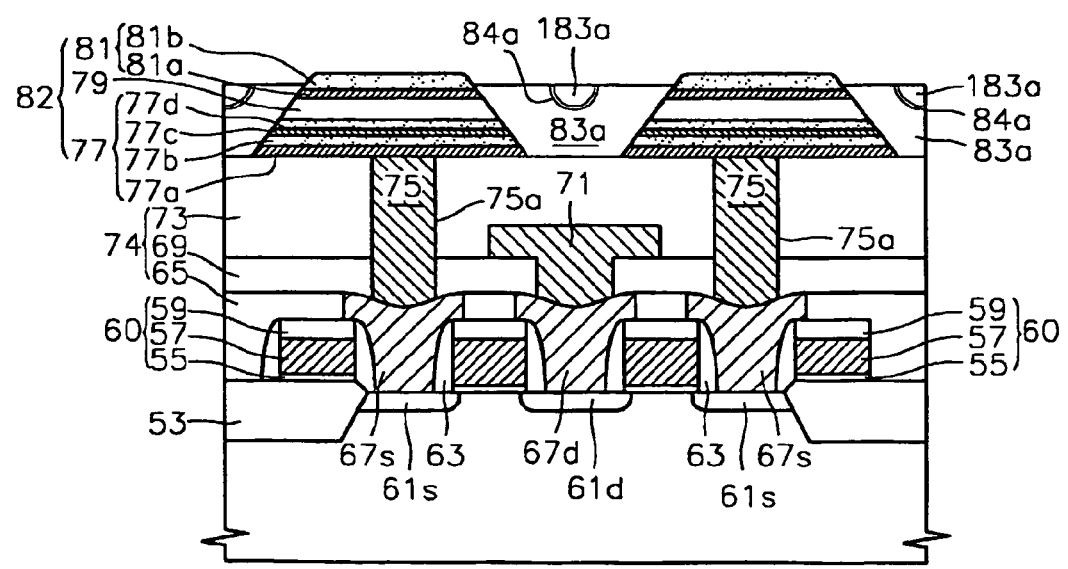

FIGS. 27 and 28 illustrate methods of fabricating a ferroelectric memory device according embodiments of the present invention corresponding to the embodiments shown in FIG. 4. As described above, such embodiments further include an encapsulated barrier layer pattern 84a. Operations through formation of the ferroelectric capacitors 82 are substantially the same as described with reference to FIGS. 11-24 and will not be further described. Referring to FIG. 27, the oxygen penetration path layer 83, the encapsulated barrier layer 84 and the insulation layer 183 are sequentially formed on the surface of a semiconductor substrate 51 in the region including the ferroelectric capacitors 82. The oxygen penetration path layer 83 is formed to a thickness selected so that an oxygen penetration path 88 can be formed as shown in FIG. 4. The insulation layer i83 may be a typical insulating material and, in particular embodiments of the present invention, is the same material as the oxygen penetration path layer 83. Selection of the same material for these layers may simplify a subsequent etch-back process.

As shown in FIG. 28, planarization may be performed on the surface of the resultant structure, for example, using an etch-back process. After etching, a gap between the ferroelectric capacitors 82 remains filled with the oxygen penetration path layer pattern 83a, the encapsulated barrier layer pattern 84a and the insulation layer pattern 183a. The surfaces of the top electrodes 81 of the ferroelectric capacitors 82 are exposed. Subsequent operations proceed as described for the embodiments of FIGS. 11-24 to provide a ferroelectric memory device having a structure corresponding to that shown in FIG. 4.

Further embodiments of methods of fabricating a ferroelectric memory device, corresponding to the device structure illustrated in FIG. 5, will now be described with reference to FIGS. 29-32. For such embodiments, operations related to forming the cell transistors, the underlying interlayer insulation layer and the contact plugs are substantially as described above and such operations will not be further described.

Figure 29:
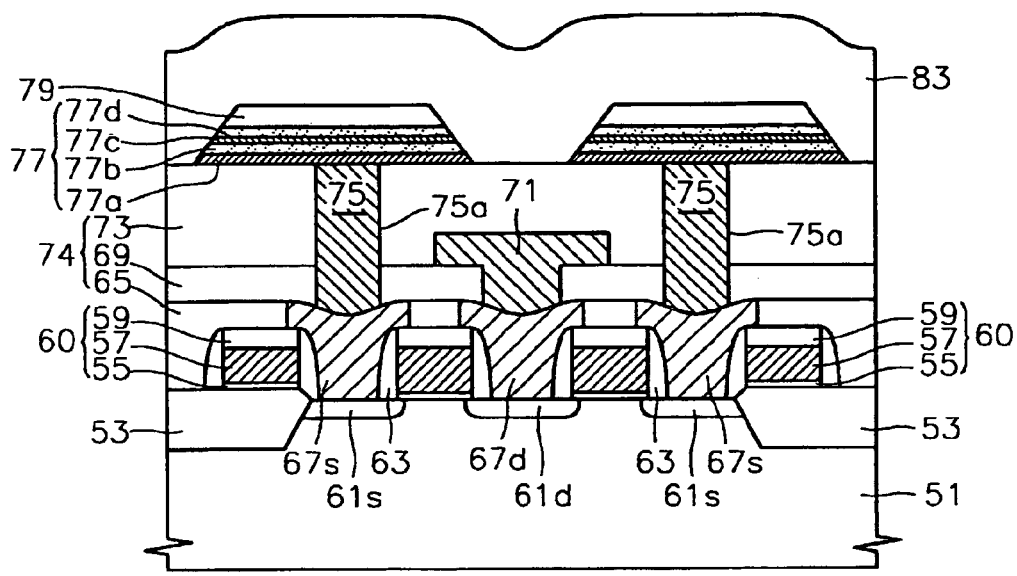
FIGS. 29-32 are cross-sectional diagrams illustrating methods of fabricating ferroelectric integrated circuit devices according to further embodiments of the present invention, taken along the line I-I' of FIG. 1.

Referring to FIG. 29, the adhesive layer 77a, the diffusion preventing layer 77b, the bottom metal oxide layer 77c, the bottom metal layer 77d, and the ferroelectric layer 79 may be sequentially formed on the underlying interlayer insulation layer 74 and contact plugs 75 as described above to form a plurality of bottom electrodes 77 covering the contact plugs 75 and a plurality of ferroelectric layer patterns 79 on the bottom electrodes 77. An oxygen penetration path layer 83, of the same materials as described above, is formed on the surface of the semiconductor substrate 51 in the region including the ferroelectric layer patterns 79 as was also described above. However, a common top electrode is formed as will now be described.

Figure 30:
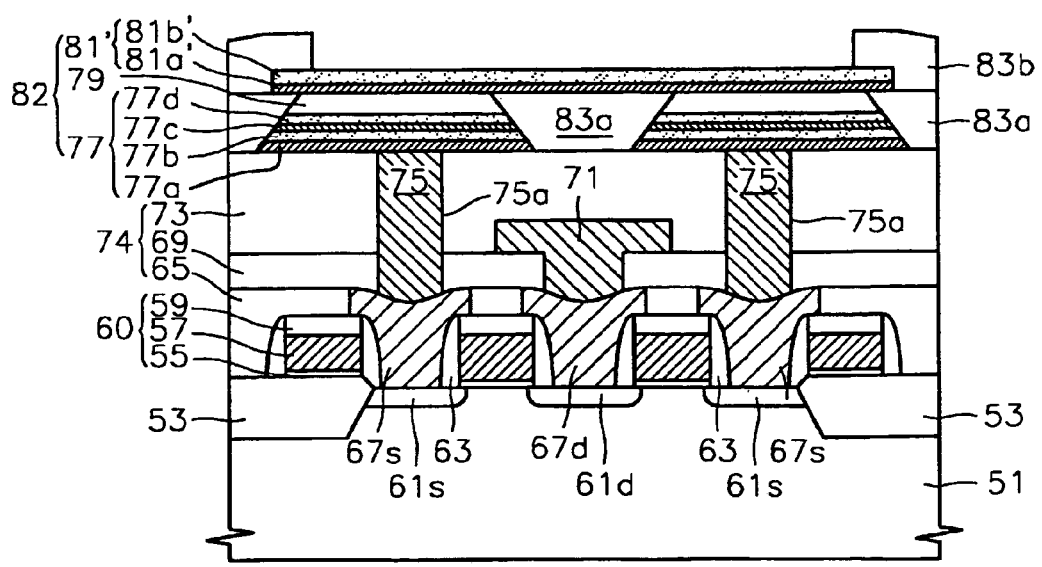

Referring to FIG. 30, the oxygen penetration path layer 83 may be planarized to expose the ferroelectric layer patterns 79. As a result, a first oxygen penetration path layer pattern 83a remains in a gap between the ferroelectric layer patterns 79 and a gap between the bottom electrodes 77. A top metal oxide layer and a top diffusion preventing layer may be sequentially formed on the surface of the resultant structure including the first oxygen penetration path layer pattern 83a to form a top electrode layer. The top electrode layer is patterned to form a plurality of common top electrodes 81' including, in the illustrated embodiments, a top metal oxide layer pattern 81a' and a top diffusion preventing layer pattern 81b', which are parallel to the word lines 57. Each of the common top electrodes 81' covers at least two adjacent rows of ferroelectric layer patterns 79. Another oxygen penetration path layer may be formed on the semiconductor substrate 51 in the region including the common top electrodes 81' and patterned to form a second oxygen penetration path layer pattern 83b, including a slit contact hole exposing the common top electrode 81'.

Figure 31:
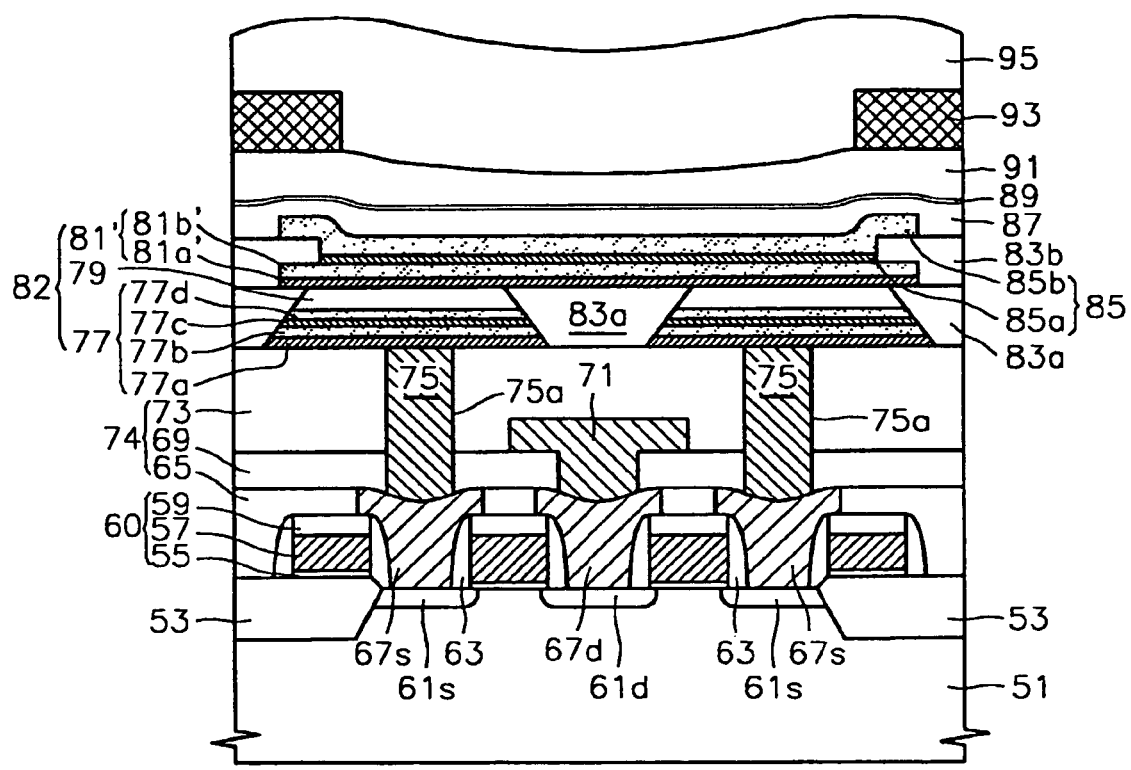

Referring to FIG. 31, the metal oxide layer 85a and the diffusion preventing layer 85b may be sequentially deposited on the surface of the semiconductor substrate 51 and patterned to form a local plate line 85 covering the slit contact hole. The oxygen penetration path layer 87 and the encapsulated barrier layer 89 are formed on the surface of the semiconductor substrate 51 in the region including the local plate line 85. Subsequently, a backend integration process may be performed on the semiconductor substrate 51, for example, formation of the first and second top interlayer insulation layers 91 and 95. In addition, a plurality of parallel main word lines 93 may be formed between the first and second top interlayer insulation layers 91 and 95. These layers may be formed in substantially the same manner as described above with reference to other embodiments of the present invention. During the backend integration process, the encapsulated barrier layer 89 may function as a barrier blocking flow of a carrier gas, for example, hydrogen gas, to control possible resulting degradation of characteristics of the underlying ferroelectric capacitors 82.

Figure 32:
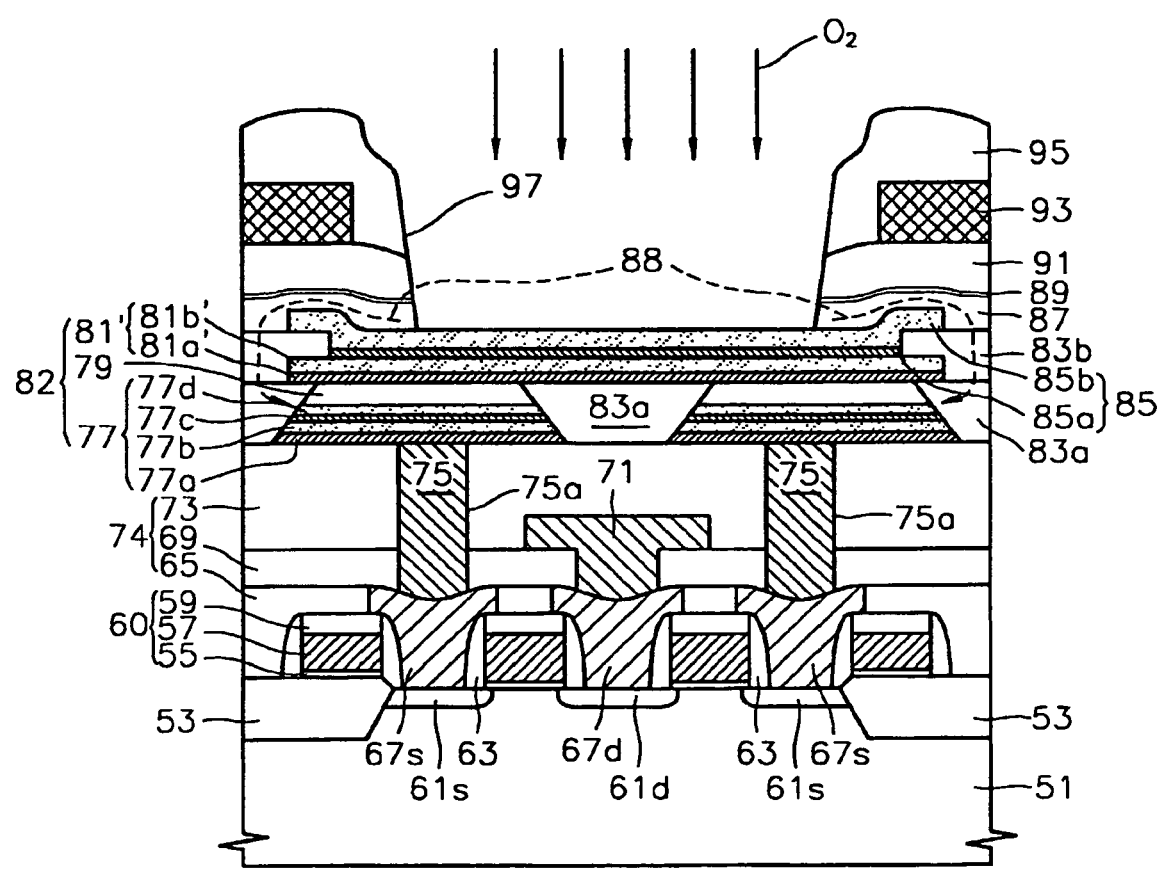

As shown in FIG. 32, a slit-type common via-hole 97 is formed extending through the second and first top interlayer insulation layers 95 and 91, the encapsulated barrier layer 89 and the oxygen penetration path layer 87. A recovery annealing process may then be performed as described with reference to other embodiments above. During the recovery annealing process, oxygen may be supplied to the ferroelectric layer pattern 79 through the oxygen penetration path 88 extending through the oxygen penetration path layer 87, the second oxygen penetration path layer pattern 83b and the first oxygen penetration path layer pattern 83a. After the recovery annealing process, a common plate line 99 may be formed as described previously to provide a ferroelectric memory device corresponding to the structure illustrated in FIG. 5.

Figure 33:
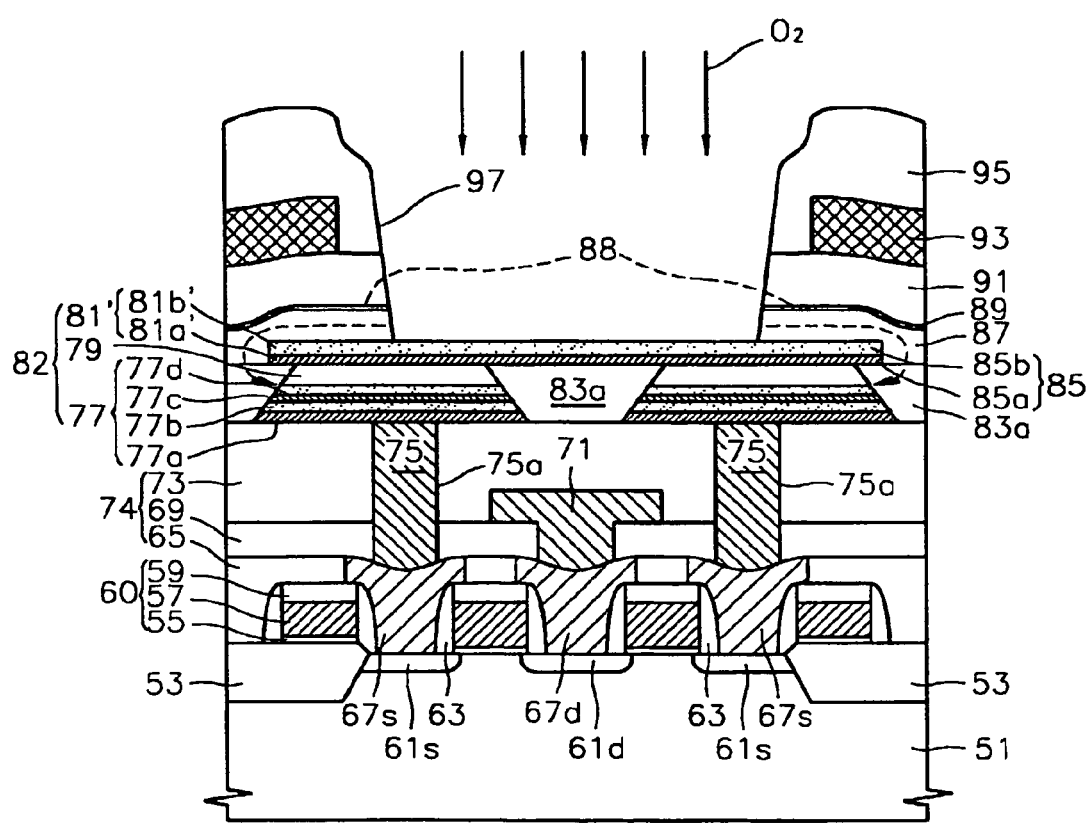
FIG. 33 is a cross-sectional diagram illustrating methods of fabricating fenroelectric integrated circuit devices according to further embodiments of the present invention, taken along the line I-I' of FIG. 1.

FIG. 33 illustrates operations for fabricating a ferroelectric memory device particular to embodiments of the present invention to provide a device structure corresponding to that illustrated in FIG. 6. As noted above, in such embodiments, the local plate line 85 is omitted. Operations through formation of the common top electrode 81' are substantially as described with reference to FIGS. 29-32. As shown in FIG. 33, the oxygen penetration path layer 87 and the encapsulated barrier layer 89 are formed on the common top electrode 81' without first forming a local plate line. Subsequently, the first and second top interlayer insulation layers 91 and 95 may be formed including a plurality of parallel main word lines 93 interposed therebetween. The second and first top interlayer insulation layer 95 and 91, the encapsulated barrier layer 89, and the oxygen penetration path layer 87 may be sequentially patterned using the top of the common top electrode 81' is an etch stop point to provide a common via hole 97. Subsequently, a recovery annealing process may be performed to reduce defects that may be present in the ferroelectric layer patterns 79. As shown in FIG. 33, oxygen is supplied to the ferroelectric layer patterns 79 through the oxygen penetration path 88 extending through the oxygen penetration path layer 87 and the oxygen penetration path layer pattern 83a. A common plate line 99 may subsequently be formed as described above to complete a ferroelectric memory device such as the embodiments illustrated in FIG. 6.

Figure 34:
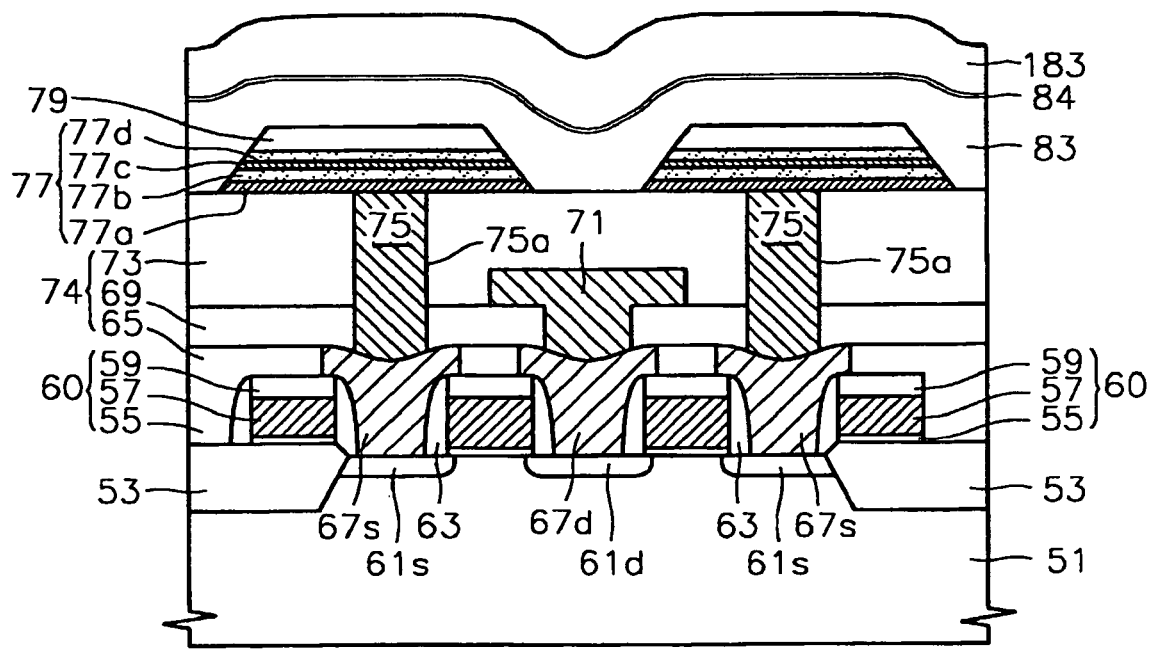
FIGS. 34 and 35 are cross-sectional diagrams illustrating methods of fabricating ferroelectric integrated circuit devices according to further embodiments of the present invention, taken along the line I-I' of FIG. 1.
Figure 35:
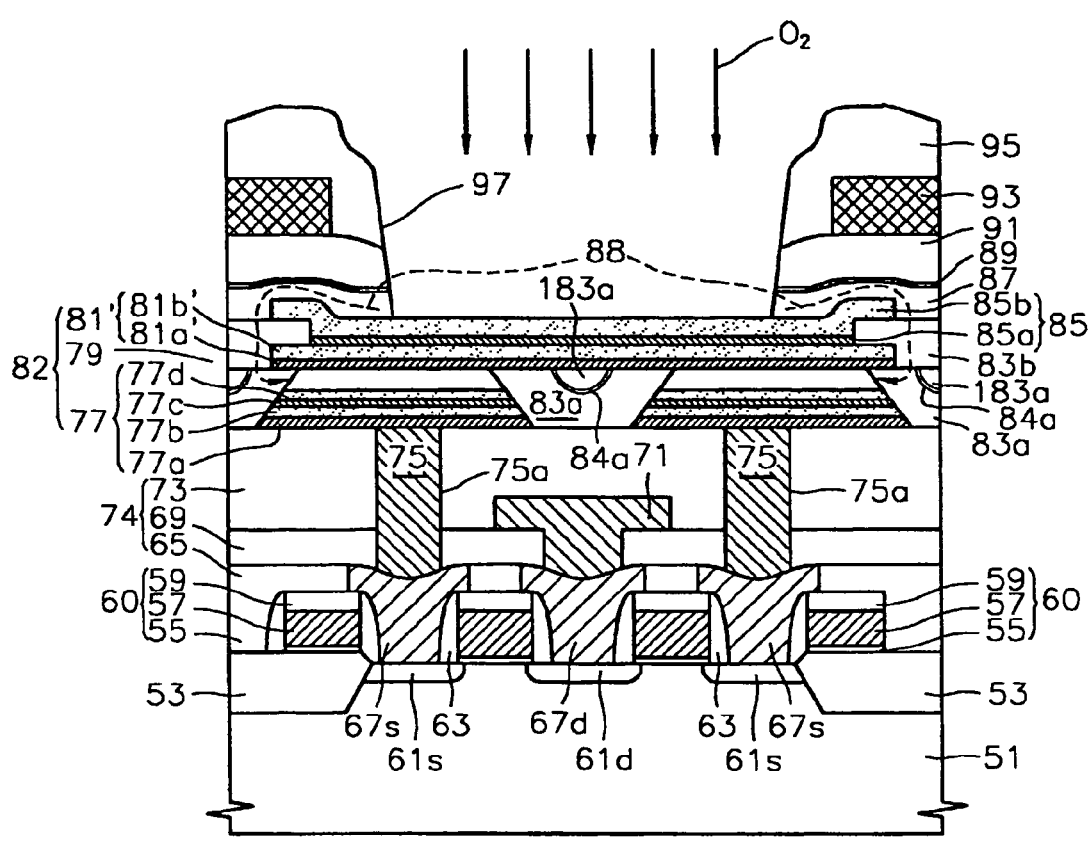

FIGS. 34 and 35 illustrate operations for fabricating a ferroelectric memory device particular to the device structure illustrated in FIG. 7. The encapsulated barrier layer pattern 84a is included in such embodiments. Referring to FIG. 34, through formation of the bottom electrodes 77 and ferroelectric layer patterns 79, operations proceed as previously described. The first oxygen penetration path layer 83, the encapsulated barrier layer 84 and the insulation layer 183 may be sequentially formed on the surface of a semiconductor substrate 51 including the ferroelectric layer patterns 79 and the bottom electrodes 77. The first oxygen penetration path layer 83 may be formed to a thickness selected so that the oxygen penetration path 88 can be formed in the ferroelectric memory device, as shown in FIG. 7. The insulation layer 183 may be formed of a typical insulating material. In some embodiments of the present invention, the insulation layer 183 is the same material as the first oxygen penetration path layer 83 in order to, for example, facilitate a subsequent etch-back process.

As shown in FIG. 35, planarization may be performed on the entire surface of the resultant structure, for example, using an etch-back process. As a result, a gap between the ferroelectric patterns 79 and the bottom electrodes 77 remains filled with a first oxygen penetration path layer pattern 83a, the encapsulated barrier pattern 84a, and the insulation layer pattern 183a. In addition, the ferroelectric layer patterns 79 are exposed. Operations related to stacking the common top electrode 81', the second oxygen penetration path layer pattern 83b, the local plate line 85, the second oxygen penetration path layer 87, the encapsulated barrier layer 89, and the first and second top interlayer insulation layers 91 and 95 including the main word lines 93 interposed therebetween and forming the slit-type common via-hole 97 exposing the local plate line 85 then proceed substantially in the same manner as previously described. During a subsequent recovery annealing process to cure defects in the ferroelectric layer patterns 79, oxygen may be supplied to the ferroelectric layer patterns 79 through the oxygen penetration path 88 extending through the second oxygen penetration path layer 87, the second oxygen penetration path layer pattern 83b, and the first oxygen penetration path layer pattern 83a. Common plate lines 99 may then be formed as described previously to provide a ferroelectric memory device having a structure a shown in FIG. 7.

Figure 36:
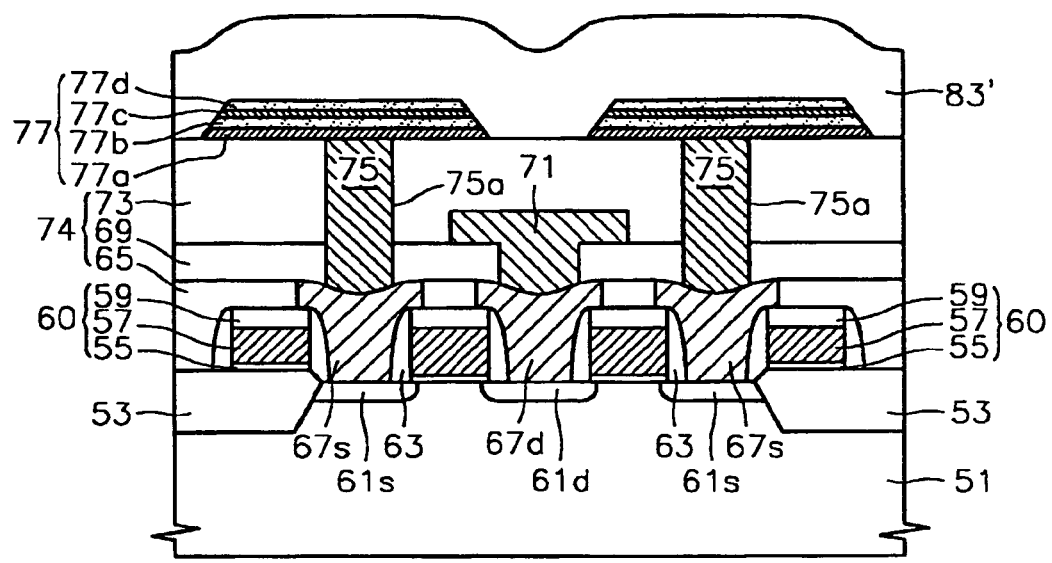
FIGS. 36-38 are cross-sectional diagrams illustrating methods of fabricating ferroelectric integrated circuit devices according to further embodiments of the present invention, taken along the line I-I' of FIG. 1.

Operations for fabricating a ferroelectric memory device according to further embodiments of the present invention to provide a structure corresponding to that shown in FIG. 8 will now be described with reference to FIGS. 36-38. The cell transistors, underlying interlayer insulation layer and contact plugs are formed in substantially the same manner as described above. As shown in FIG. 36, the adhesive layer 77a, diffusion preventing layer 77b, bottom metal oxide layer 77c and bottom metal layer 77d may be sequentially formed on the underlying interlayer insulation layer 74 and contact plugs 75 and patterned to form a plurality of bottom electrodes 77 covering the contact plugs 75. An insulation layer 83' may be formed on the surface of a semiconductor substrate 51 in a region including the bottom electrodes 77.

Figure 37:
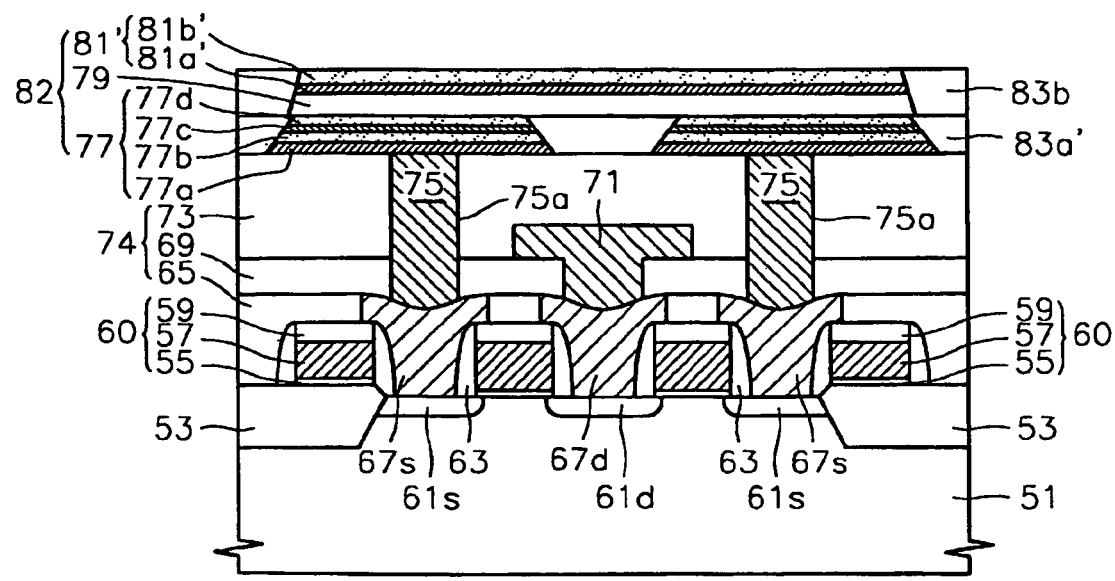

Referring now to FIG. 37, the insulation layer 83' may be planarized to expose the tops of the bottom electrodes 77. The insulation layer pattern 83a' remains in a gap between the bottom electrodes 77. The ferroelectric layer, top metal oxide layer and top diffusion preventing layer may be sequentially formed on the surface of the resultant structure including the insulation layer pattern 83a' and patterned to form a plurality of common ferroelectric layer patterns 79' parallel to the word lines 57 and a plurality of common top electrodes 81' on the common ferroelectric layer patterns 79'. Each of the common ferroelectric layer patterns 79' shown in FIG. 37 covers at least two adjacent rows of bottom electrodes 77. An oxygen penetration path layer is formed on the surface of the resultant structure and is planarized to form the oxygen penetration path layer pattern 83b filling a gap between the common ferroelectric layer patterns 79' and the common top electrodes 81'.

Figure 38:
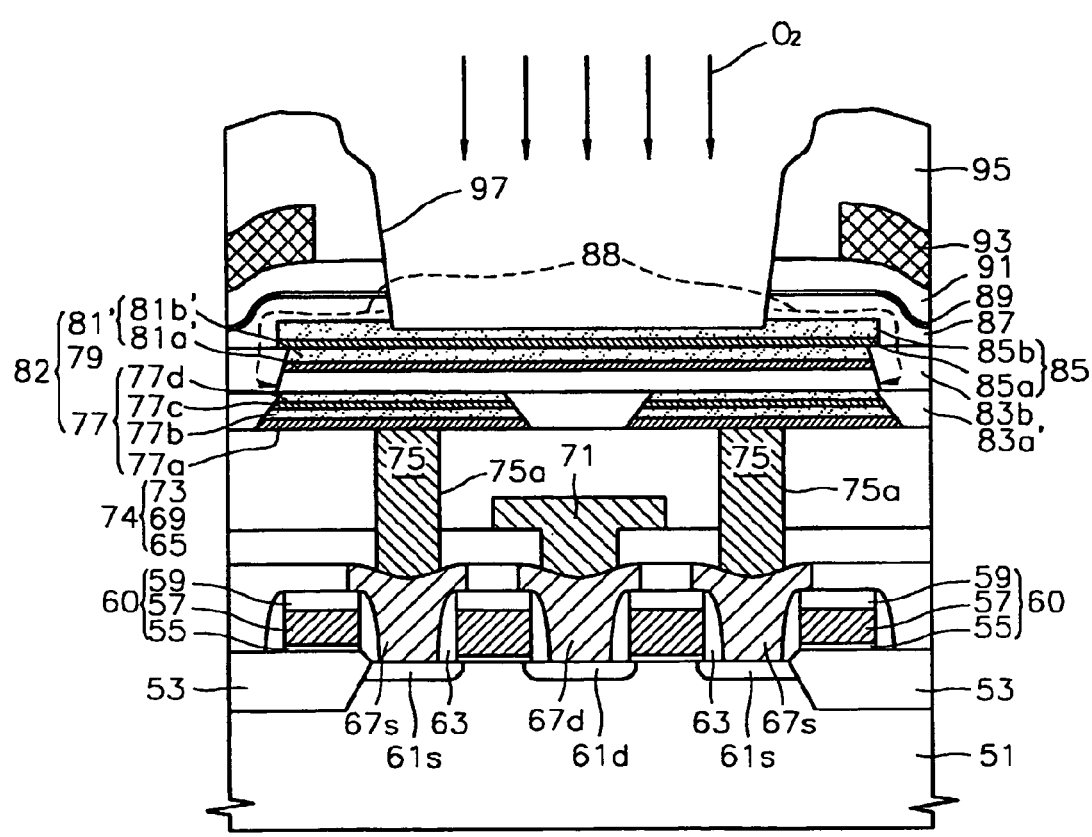

Referring to FIG. 38, the metal oxide layer 85a and the diffusion preventing layer 85b may be sequentially formed on the surface of the semiconductor substrate 51 in the entire region including the oxygen penetration path layer pattern 83b and these layers may be patterned to form a plurality of local plate lines 85, each covering a common top electrode 81'. The oxygen penetration path layer 87 and encapsulated barrier layer 89 may be formed on the entire surface of the resultant structure. A backend integration process may be subsequently performed on the semiconductor substrate 51 including the encapsulated barrier layer 89 during which the encapsulated barrier layer 89 may effectively prevent degradation of the characteristics of capacitors 82 due to contact with a carrier gas used in the backend integration process. The first top interlayer insulation layer 91, plurality of main word lines 93 and second top interlayer insulation layer 95 and plurality of slit-type common via-holes 97, each exposing the top of a local plate line 85, may then be formed. A recovery annealing process may then be performed as described above. During the recovery annealing process, oxygen may be supplied to the common ferroelectric patterns 79' of the capacitors 82 through the oxygen penetration path 88 extending through the oxygen penetration path layer 87 and the oxygen penetration path layer pattern 83b to cure defects in the common ferroelectric patterns 79'. In particular embodiments of the present invention to facilitate a supply of oxygen to the surface of the common ferroelectric layer patterns 79', the insulation layer pattern 83a' filling the gap between the bottom electrodes 77 is the same material as the oxygen penetration path layer pattern 83b. Common plate lines may then be formed, as described above, to provide a ferroelectric memory device having a structure as described with reference to FIG. 8.

Figure 39:
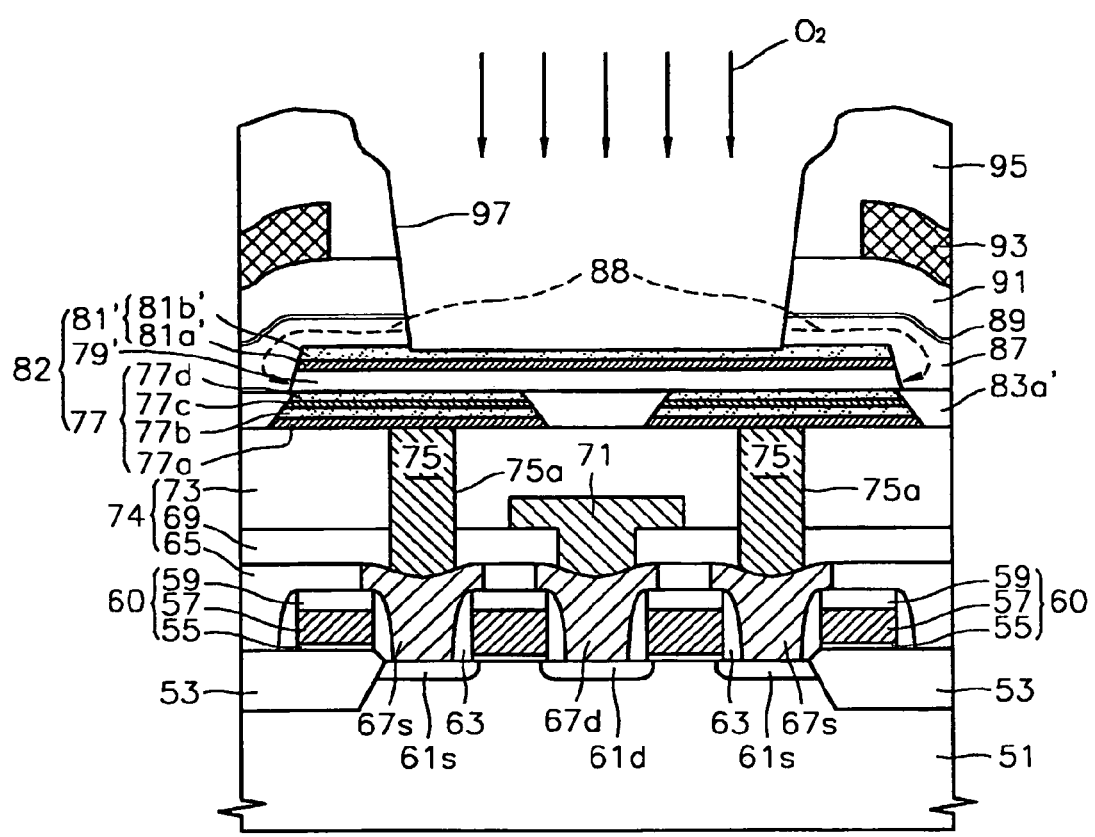
FIG. 39 is a cross-sectional diagram illustrating methods of fabricating ferroelectric integrated circuit devices according to further embodiments of the present invention, taken along the line I-I' of FIG. 1.

FIG. 39 shows operations for further method embodiments to provide a device structure corresponding to that shown in FIG. 9 with no local plate lines 85. Through formation of the common ferroelectric layer patterns 79' and the common top electrodes 81', operations proceed as described with reference to FIGS. 36-38. The oxygen penetration path layer 87 and encapsulated barrier layer 89 are formed on the common ferroelectric layer patterns 79' and the common top electrodes 81' without forming local plate lines. Subsequently, first and second top interlayer insulation layers 91 and 95 may be formed including main word lines 93 interposed therebetween. The second and first top interlayer insulation layers 95 and 91, the encapsulated barrier layer 89, and the oxygen penetration path layer 87 may be sequentially patterned using the tops of the common top electrodes 81' as etch stop points. Thereafter, a recovery annealing process may be performed to cure defects in the common ferroelectric layer patterns 79'. As shown in FIG. 39, oxygen may be supplied to the common ferroelectric layer patterns 79' through the oxygen penetration path 88 extending through only the oxygen penetration path layer 87. Finally, common plate lines 99 may be formed, as described above, to provide a device structure as shown in FIG. 9.

Figure 40:
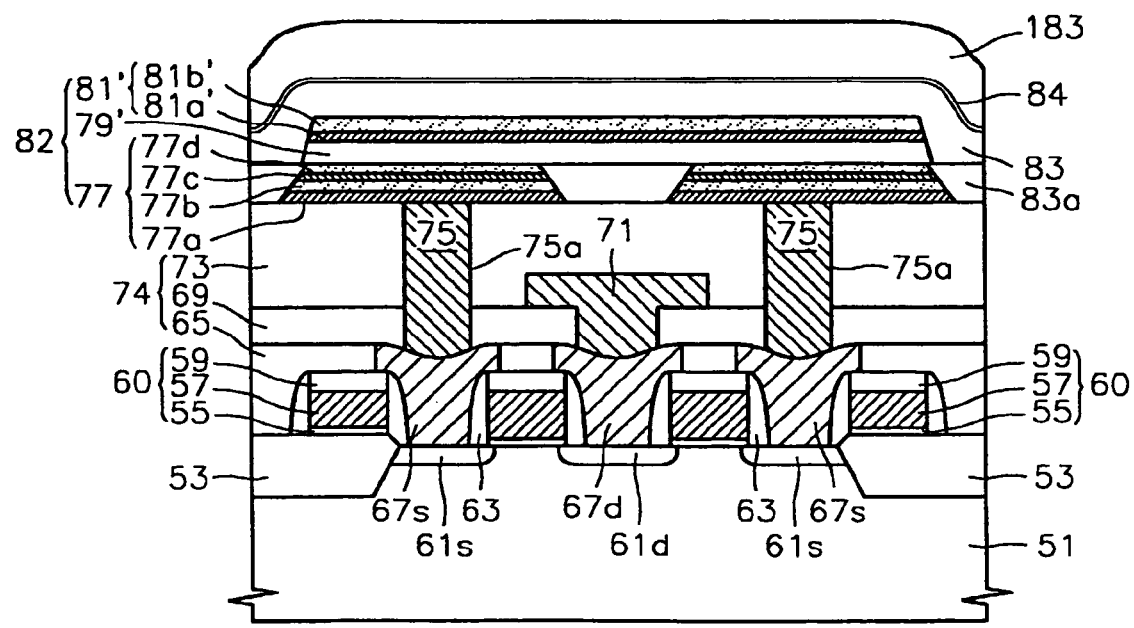
FIGS. 40 and 41 are cross-sectional diagrams illustrating methods of fabricating ferroelectric integrated circuit devices according to further embodiments of the present invention, taken along the line I-I' of FIG. 1.

Finally, operations related to fabricating a device structure corresponding to that illustrated in FIG. 10 will be described with reference to FIGS. 40 and 41. Such embodiments include the encapsulated barrier layer pattern 84a. Operations related to forming the bottom electrodes 77, filling the insulation layer pattern 83a' in a gap between the bottom electrodes 77 and forming common ferroelectric layer patterns 79' and common top electrodes 81' proceed substantially as described above. Subsequently, the oxygen penetration path layer 83, encapsulated barrier layer 84 and insulation layer 183 may be sequentially formed on the entire surface of a semiconductor substrate 51 in the region including the common ferroelectric layer patterns 79' and the common top electrodes 81'. The oxygen penetration path layer 83 may be formed to a thickness selected so that the oxygen penetration path 88 can be formed as shown in FIG. 7. The insulation layer 183 may be formed of a typical insulating substance. In particular embodiments of the present invention, the layer 183 and the oxygen penetration path layer 83 are the same material in order to, for example, simplify a later etch-back process.

Figure 41:
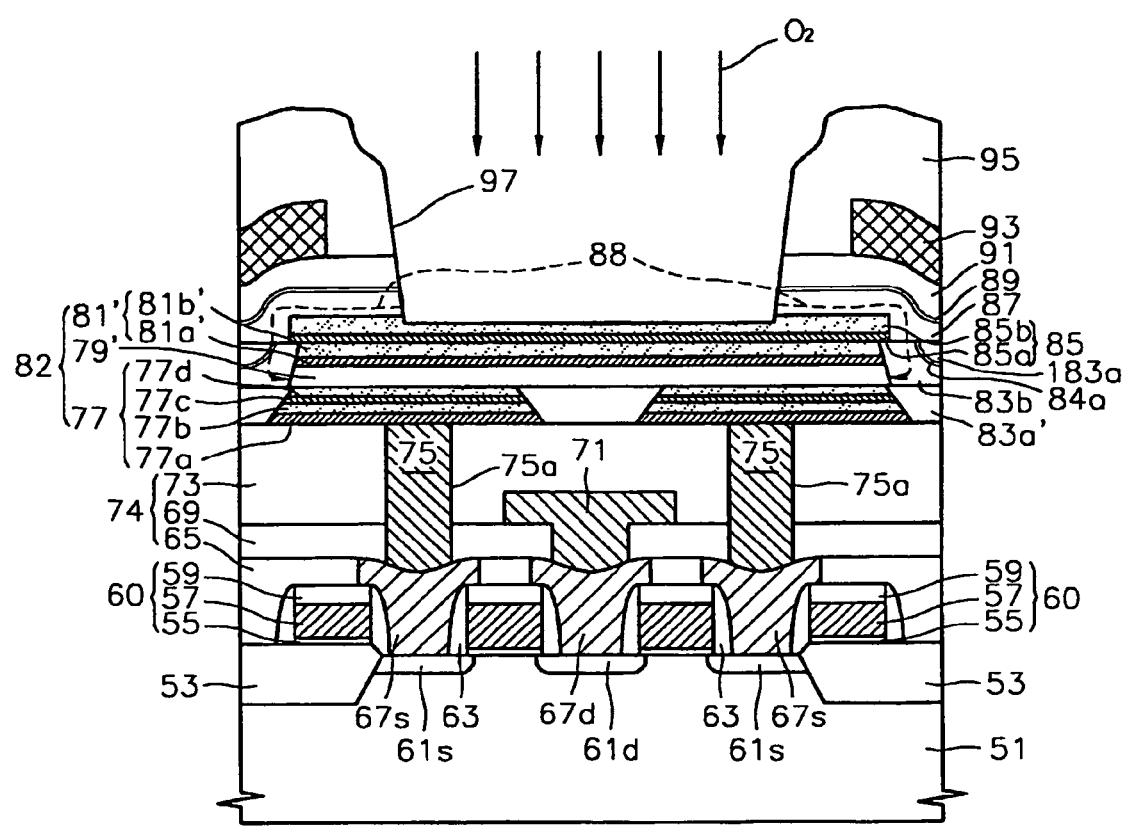

As shown in FIG. 41, planarization may be performed on the entire surface of the resultant structure, for example, using an etch-back process. As a result, a gap between the common ferroelectric patterns 79' and the common top electrodes 81' remains filled with the oxygen penetration path layer pattern 83b, the encapsulated barrier pattern 84a, and the insulation layer pattern 183a, and the tops of the common top electrodes 81' are exposed. Subsequent operations related to stacking, local plate line 85, oxygen penetration path layer 87, encapsulated barrier layer 89 and first and second top interlayer insulation layers 91 and 95 including main word lines 93 interposed therebetween and forming the slit-type common via-hole 97 exposing the top of the local plate line 85 may proceed in substantially the same manner as described previously. Thereafter, a recovery annealing process may be performed to reduce defects in the common ferroelectric layer patterns 79'. Oxygen may be supplied to the ferroelectric layer patterns 79 through the oxygen penetration path 88 extending through the oxygen penetration path layer 87 and the oxygen penetration path layer pattern 83b. Finally, common plate lines 99 may be formed, as described above, to provide a ferroelectric memory device having a structure as shown in FIG. 10.

The characteristics of ferroelectric memory devices according to various embodiments of the present invention will now be further described with reference to the hysteresis loops in FIGS. 42a and 42b and the graph of remnant polarization values in FIG. 43.

A ferroelectric memory device as illustrated in FIG. 2 and a ferroelectric memory device as illustrated in FIG. 4 were evaluated. In particular, the ferroelectric memory devices included a capacitor composed of a top electrode ($Ir/IrO_2$), a ferroelectric layer pattern (PZT) and a bottom electrode ($Pt/IrO_2/Ir$) and had a thickness of about 400 nm and a size of about 0.44 $\mu m^2$. A local plate line was included formed from an $Ir/IrO_2$ stack layer. The oxygen penetration path layer was a TiO$_2$ layer and the encapsulated barrier layer was an Al$_2$O$_3$ layer having a thickness of about 100 Å. Hysteresis loops and remnant polarization values were measured with respect to these ferroelectric memory devices.

Figure 42A:
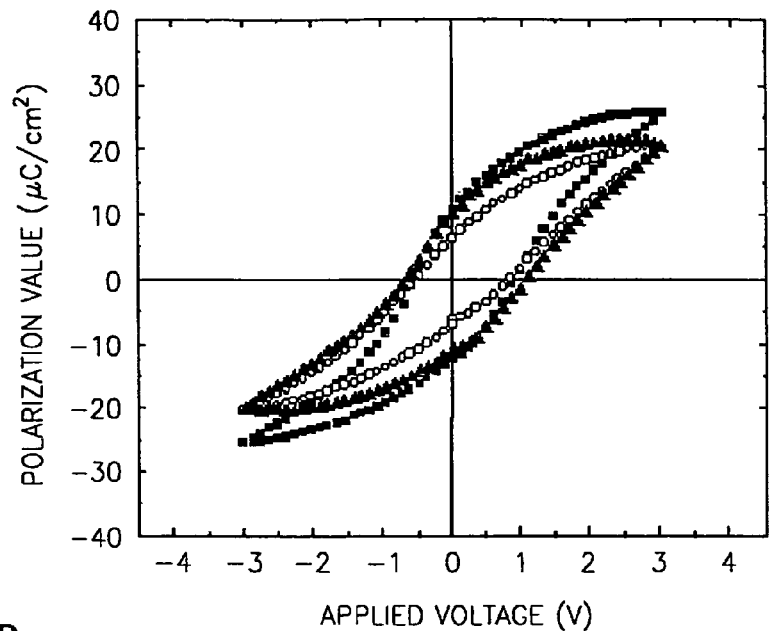
FIG. 42A is a graph illustrating the hysteresis loop of a ferroelectric memory device according to embodiments of the present invention.
Figure 42B:
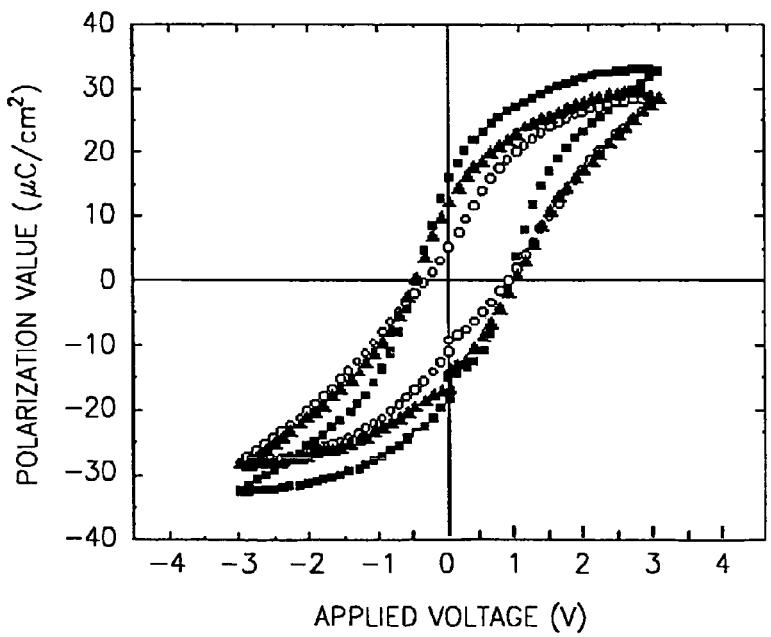
FIG. 42B is a graph illustrating the hysteresis loop of a ferroelectric memory device according to further embodiments of the present invention.

FIG. 42A is a graph of the hysteresis loop of the ferroelectric memory device having the structure shown in FIG. 2 and FIG. 42B is a graph of the hysteresis loop of the ferroelectric memory device having the structure shown in FIG. 4. The horizontal axis is an applied voltage and the vertical axis is a polarization value. The hysteresis loop denoted by -■- is measured immediately after the local plate lines are formed, the hysteresis loop denoted by -○- is measured immediately after the slit-type common via-holes are formed and the hysteresis loop denoted by -▲- is measured after a recovery annealing process is performed. It can be seen from FIGS. 42A and 42B that the hysteresis loop measured after formation of local plate lines is degraded, as expected, following the backend integration process(es) and formation of the slit-type common via-holes, but substantially recovers to almost a normal state after the recovery annealing process.

Figure 43:
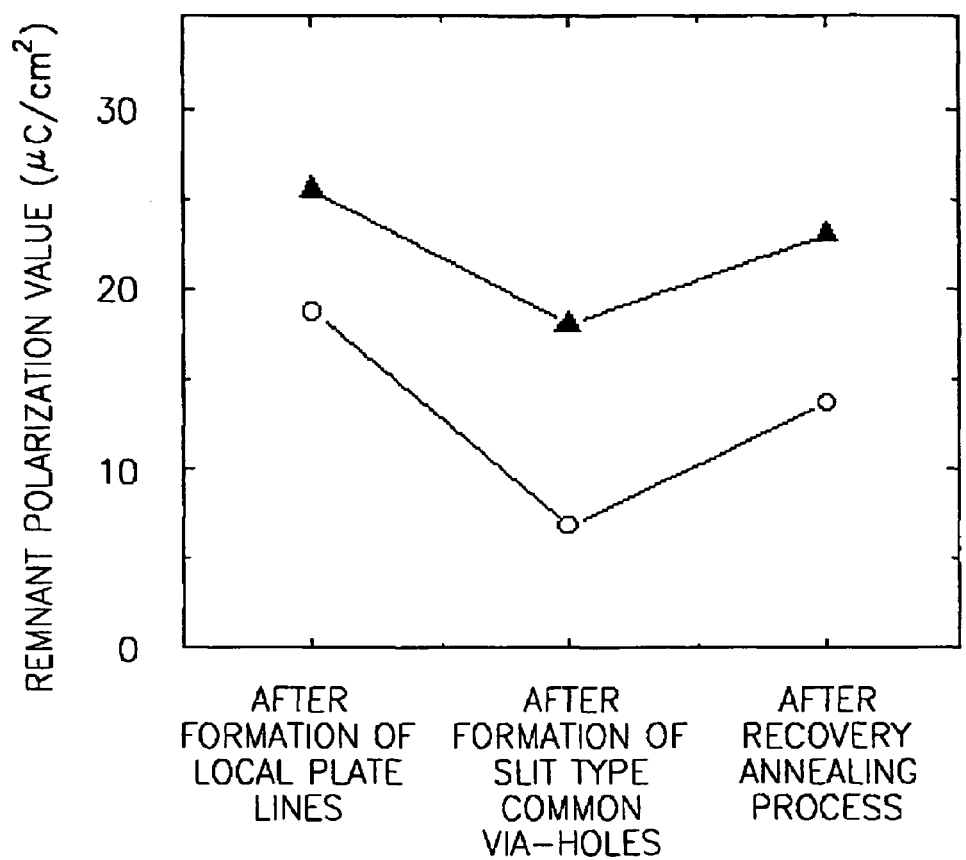
FIG. 43 is a graph illustrating remnant polarization values measured during fabrication according to embodiments of the present invention.

FIG. 43 is a graph showing remnant polarization values. The graph denoted by -○- shows remnant polarization values measured during fabrication of a ferroelectric memory device according to embodiments of the present invention illustrated in FIG. 2 and the graph denoted by -▲- shows remnant polarization values measured during fabrication of a ferroelectric memory device according to the embodiments illustrated in FIG. 4. Remnant polarization values measured after formation of local plate lines decrease after formation of slit-type common via-holes but substantially recover to the initial levels after the recovery annealing process.

The present invention is not restricted to the above-described embodiments, but modifications and changes may be made therein by those skilled in the art. For example, each plate line may cover at least three adjacent rows of ferroelectric capacitors. Other variations will be understood by those of skill in the art in light of the embodiments described above.

According to various embodiments of the present invention, ferroelectric capacitors may be wrapped by an encapsulated barrier layer with an oxygen penetration path interposed therebetween. As a result, the ferroelectric capacitors may be protected from damage by a reducing gas used during a backend integration process. Moreover, embodiments of the present invention include an oxygen penetration path through which oxygen vacancies in ferroelectric layer patterns can be effectively cured by a recovery annealing process. Thus, improved ferroelectric capacitors may be provided and ferroelectric memory devices including these capacitors may have improved operating characteristics.

It should be noted that many variations and modifications may be made to the embodiments described above without substantially departing from the principles of the present invention. All such variations and modifications are intended to be included herein within the scope of the present invention, as set forth in the following claims.

We claim:

1. A ferroelectric memory device, comprising:
an underlying interlayer insulation layer formed on a semiconductor substrate;
a plurality of ferroelectric capacitors arranged two-dimensionally on the underlying interlayer insulation layer in row and column directions, wherein each of the ferroelectric capacitors comprises a bottom electrode, a ferroelectric layer pattern, and a top electrode, all of which are stacked sequentially;
an encapsulated barrier layer indirectly wrapping the ferroelectric capacitors with an oxygen penetration path being interposed therebetween;
a top interlayer insulation layer formed on the encapsulated barrier layer; and
a plurality of plate lines parallel to the row direction and each electrically connected to at least two adjacent rows of ferroelectric capacitors, wherein each of the plurality of plate lines directly contacts at least two adjacent rows of top electrodes;
wherein the plate lines comprise local plate lines each of which directly contacts at least two adjacent rows of the top electrodes of the ferroelectric capacitors,
a gap between the ferroelectric capacitors is filled with an oxygen penetration path layer pattern; and
the oxygen penetration path comprises the oxygen penetration path layer pattern and an oxygen penetration path layer covering the top of the oxygen penetration path layer pattern and the local plate lines.

2. The ferroelectric memory device of claim 1, wherein the oxygen penetration path comprises an oxygen penetration path layer and/or an oxygen penetration path layer pattern which wraps the ferroelectric capacitors and is made of titanium oxide or silicon oxide.

3. The ferroelectric memory device of claim 1, wherein the encapsulated barrier layer is a metal oxide layer selected from the group consisting of an aluminum oxide layer, a titanium oxide layer, a zirconium oxide layer, a tantalum oxide layer, and a cesium oxide layer.

4. The ferroelectric memory device of claim 3, wherein the encapsulated barrier layer is a double layer composed of a metal oxide layer which is heat-treated and a metal oxide layer which is formed on the heat-treated metal oxide layer without being heat-treated.

5. A ferroelectric memory device, comprising:
an underlying interlayer insulation layer formed on a semiconductor substrate;
a plurality of ferroelectric capacitors arranged two-dimensionally on the underlying interlayer insulation layer in row and column directions, wherein each of the ferroelectric capacitors comprises a bottom electrode, a ferroelectric layer pattern, and a top electrode, all of which are stacked sequentially;
an encapsulated barrier layer indirectly wrapping the ferroelectric capacitors with an oxygen penetration path being interposed therebetween;
a top interlayer insulation layer formed on the encapsulated barrier layer; and
a plurality of plate lines parallel to the row direction and each electrically connected to at least two adjacent rows of ferroelectric capacitors, wherein each of the plurality of plate lines directly contacts at least two adjacent rows of top electrodes;
wherein the plate lines comprise local plate lines each of which directly contacts at least two adjacent rows of the ferroelectric capacitors,
a gap between the ferroelectric capacitors is filled with an oxygen penetration path layer pattern contacting the ferroelectric capacitors, an encapsulated barrier layer pattern contacting the oxygen penetration path layer pattern, and an insulation layer pattern contacting the encapsulated barrier layer pattern; and
the oxygen penetration path comprises the oxygen penetration path layer pattern and an oxygen penetration path layer covering the top of the oxygen penetration path layer pattern and the local plate lines.

6. The ferroelectric memory device of claim 5, wherein the plate lines further comprise common plate lines each of which directly contacts the top of a local plate line through a slit-type common via-hole piercing through the top interlayer insulation layer, the encapsulated barrier layer, and the oxygen penetration path layer.

7. The ferroelectric memory device of claim 5, wherein the oxygen penetration path comprises an oxygen penetration path layer and/or an oxygen penetration path layer pattern which wraps the ferroelectric capacitors and is made of titanium oxide or silicon oxide.

8. The ferroelectric memory device of claim 5, wherein the encapsulated barrier layer is a metal oxide layer selected from the group consisting of an aluminum oxide layer, a titanium oxide layer, a zirconium oxide layer, a tantalum oxide layer, and a cesium oxide layer.

9. A ferroelectric memory device comprising:
an underlying interlayer insulation layer formed on a semiconductor substrate;
a plurality of ferroelectric capacitors arranged two-dimensionally on the underlying interlayer insulation layer in row and column directions;
an encapsulated barrier layer indirectly wrapping the ferroelectric capacitors with an oxygen penetration path being interposed therebetween, wherein the encapsulated barrier layer is a double layer composed of a metal oxide layer which is heat-treated and a metal oxide layer which is formed on the heat-treated metal oxide layer without being heat-treated;
a top interlayer insulation layer formed on the encapsulated barrier layer; and
a plurality of plate lines parallel to the row direction and each electrically connected to at least two adjacent rows of ferroelectric capacitors;
wherein the plate lines comprise local plate lines each of which directly contacts the common top electrodes,
a gap between the bottom electrodes and the ferroelectric layer patterns is filled with a first oxygen penetration path layer pattern;
a gap between the common top electrodes is filled with a second oxygen penetration path layer pattern; and
the oxygen penetration path comprises the first and second oxygen penetration path layer patterns and an oxygen penetration path layer covering the top of the second oxygen penetration path layer pattern and the local plate lines.

10. The ferroelectric memory device of claim 9 wherein the oxygen penetration path is made of titanium oxide or silicon oxide.

11. The ferroelectric memory device of claim 9, wherein the encapsulated barrier layer is a metal oxide layer selected from the group consisting of an aluminum oxide layer, a titanium oxide layer, a zirconium oxide layer, a tantalum oxide layer, and a cesium oxide layer.

12. A ferroelectric memory device comprising:
an underlying interlayer insulation layer formed on a semiconductor substrate;
a plurality of ferroelectric capacitors arranged two-dimensionally on the underlying interlayer insulation layer in row and column directions;
an encapsulated barrier layer indirectly wrapping the ferroelectric capacitors with an oxygen penetration path being interposed therebetween, wherein the encapsulated barrier layer is a double layer composed of a metal oxide layer which is heat-treated and a metal oxide layer which is formed on the heat-treated metal oxide layer without being heat-treated;
a top interlayer insulation layer formed on the encapsulated barrier layer; and
a plurality of plate lines parallel to the row direction and each electrically connected to at least two adjacent rows of ferroelectric capacitors;
wherein the plate lines comprise local plate lines each of which directly contacts the common top electrode;
a gap between the bottom electrodes and the ferroelectric layer patterns is filled with a first oxygen penetration path layer pattern contacting the bottom electrodes and the ferroelectric layer patterns, an encapsulated barrier layer pattern contacting the first oxygen penetration path layer pattern, and an insulation layer pattern contacting the encapsulated barrier layer pattern;
a gap between the common top electrodes is filled with the second oxygen penetration path layer pattern; and
the oxygen penetration path comprises the first and second oxygen penetration path layer patterns and an oxygen penetration path layer covering the top of the second oxygen penetration path layer pattern and the local plate lines.

13. The ferroelectric memory device of claim 12, wherein the plate lines further comprise common plate lines each of which directly contacts the top of a local plate line through a slit-type common via-hole piercing through the top interlayer insulation layer, the encapsulated barrier layer, and the oxygen penetration path layer.

14. A ferroelectric memory device comprising:
an underlying interlayer insulation layer formed on a semiconductor substrate;
a plurality of ferroelectric capacitors arranged two-dimensionally on the underlying interlayer insulation layer in row and column directions;
an encapsulated barrier layer indirectly wrapping the ferroelectric capacitors with an oxygen penetration path being interposed therebetween, wherein the encapsulated barrier layer is a double layer composed of a metal oxide layer which is heat-treated and a metal oxide layer which is formed on the heat-treated metal oxide layer without being heat-treated;
a top interlayer insulation layer formed on the encapsulated barrier layer; and
a plurality of plate lines parallel to the row direction and each electrically connected to at least two adjacent rows of ferroelectric capacitors;
wherein the ferroelectric layer pattern comprises a common ferroelectric layer pattern and wherein the common ferroelectric layer pattern covers at least two adjacent rows of the bottom electrodes and the common top electrode is formed on the top of the common ferroelectric layer pattern;
wherein the plate lines comprise local plate lines each of which directly contacts the common top electrodes,
a gap between the common ferroelectric layer patterns and the common top electrodes is filled with an oxygen penetration path layer pattern; and
the oxygen penetration path comprises the oxygen penetration path layer pattern and an oxygen penetration path layer covering the top of the oxygen penetration path layer pattern and the local plate lines.

15. A ferroelectric memory device comprising:
an underlying interlayer insulation layer formed on a semiconductor substrate;
a plurality of ferroelectric capacitors arranged two-dimensionally on the underlying interlayer insulation layer in row and column directions;

an encapsulated barrier layer indirectly wrapping the ferroelectric capacitors with an oxygen penetration path being interposed therebetween, wherein the encapsulated barrier layer is a double layer composed of a metal oxide layer which is heat-treated and a metal oxide layer which is formed on the heat-treated metal oxide layer without being heat-treated;

a top interlayer insulation layer formed on the encapsulated barrier layer; and a plurality of plate lines parallel to the row direction and each electrically connected to at least two adjacent rows of ferroelectric capacitors;

wherein the ferroelectric layer pattern comprises a common ferroelectric layer pattern and wherein the common ferroelectric layer pattern covers at least two adjacent rows of the bottom electrodes and the common top electrode is formed on the top of the common ferroelectric layer pattern;

wherein the plate lines comprise local plate lines each of which is electrically connected to at least two adjacent rows of the ferroelectric capacitors, a gap between the common ferroelectric layer patterns and the common top electrodes is filled with an oxygen penetration path layer pattern contacting the common ferroelectric patterns and the common top electrodes, an encapsulated barrier layer pattern contacting the oxygen penetration path layer pattern, and an insulation layer pattern contacting the encapsulated barrier layer pattern; and the oxygen penetration path comprises the oxygen penetration path layer pattern and an oxygen penetration path layer covering the top of the oxygen penetration path layer pattern and the local plate lines.

16. The ferroelectric memory device of claim 15, wherein the plate lines further comprise common plate lines each of which directly contacts the top of a local plate line through a slit-type common via-hole piercing through the top interlayer insulation layer, the encapsulated barrier layer, and the oxygen penetration path layer.

* * * * *